(12) United States Patent
Kambe et al.

(10) Patent No.: US 6,599,631 B2
(45) Date of Patent: Jul. 29, 2003

(54) POLYMER-INORGANIC PARTICLE COMPOSITES

(75) Inventors: Nobuyuki Kambe, Menlo Park, CA (US); Yigal Do Blum, San Jose, CA (US); Benjamin Chaloner-Gill, San Jose, CA (US); Shivkumar Chiruvolu, Sunnyvale, CA (US); Sujeet Kumar, Newark, CA (US); David Brent MacQueen, Half Moon Bay, CA (US)

(73) Assignee: NanoGram Corporation, Fremont, CA (US)

( * ) Notice: Subject to any disclaimer, the term of this patent is extended or adjusted under 35 U.S.C. 154(b) by 0 days.

(21) Appl. No.: 09/818,141

(22) Filed: Mar. 27, 2001

(65) Prior Publication Data

US 2002/0192476 A1 Dec. 19, 2002

Related U.S. Application Data

(60) Provisional application No. 60/265,169, filed on Jan. 26, 2001.

(51) Int. Cl.$^7$ .............................................. B32B 25/20
(52) U.S. Cl. ........................ 428/447; 524/401; 524/493; 524/497; 524/404; 524/405; 524/409; 524/403; 524/431; 524/538; 524/588; 524/556; 524/557; 524/537; 524/577; 524/589; 524/602; 428/457; 428/458; 428/461; 428/688; 428/364; 428/521; 428/44; 428/391; 428/403; 523/200
(58) Field of Search .................... 524/401, 493, 524/497, 404, 405, 409, 403, 431, 538, 588, 556, 557, 537, 577, 589, 602; 428/457, 458, 461, 688, 364, 521, 44, 447, 391, 403; 359/237; 523/200

(56) References Cited

U.S. PATENT DOCUMENTS

| | | | |
|---|---|---|---|
| 4,828,695 A | * | 5/1989 | Yamamura et al. |
| 4,842,832 A | | 6/1989 | Inoue et al. |
| 4,844,578 A | | 7/1989 | Pierini et al. |
| 4,972,008 A | * | 11/1990 | Lee et al. |
| 5,108,201 A | | 4/1992 | Matsuura et al. |
| 5,130,362 A | | 7/1992 | Psasad et al. |
| 5,372,749 A | * | 12/1994 | Li et al. |
| 5,447,708 A | | 9/1995 | Helble et al. |
| 5,494,949 A | | 2/1996 | Kinkel et al. |
| 5,497,445 A | | 3/1996 | Imoto |
| 5,698,309 A | | 12/1997 | Dallmann et al. |
| 5,789,326 A | | 8/1998 | Hansen et al. |
| 5,807,364 A | | 9/1998 | Hansen |
| 5,837,804 A | | 11/1998 | Yamagishi et al. |
| 5,853,809 A | * | 12/1998 | Campbell et al. |
| 5,857,039 A | | 1/1999 | Bose et al. |
| 5,952,125 A | | 9/1999 | Bi et al. |
| 5,958,348 A | | 9/1999 | Bi et al. |
| 5,965,299 A | | 10/1999 | Khan et al. |
| 5,968,652 A | | 10/1999 | Hanggi et al. |
| 5,989,111 A | | 11/1999 | Lamphere et al. |
| 5,989,514 A | | 11/1999 | Bi et al. |
| 5,990,024 A | | 11/1999 | Blum et al. |
| 5,997,795 A | | 12/1999 | Danforth et al. |
| 6,002,522 A | | 12/1999 | Todori et al. |
| 6,005,707 A | | 12/1999 | Berggren et al. |
| 6,026,209 A | | 2/2000 | Rhee et al. |
| 6,080,337 A | | 6/2000 | Kambe et al. |
| 6,088,492 A | | 7/2000 | Kancko et al. |
| 6,106,798 A | | 8/2000 | Kambe et al. |
| 6,107,364 A | | 8/2000 | Fong et al. |
| 6,136,287 A | | 10/2000 | Horne et al. |
| 6,136,905 A | * | 10/2000 | Suzuki et al. |
| 6,139,626 A | | 10/2000 | Norris et al. |
| 6,144,795 A | | 11/2000 | Dawes et al. |
| 6,229,949 B1 | | 5/2001 | Ido et al. |
| 6,236,774 B1 | | 5/2001 | Lackritz et al. |
| 6,311,004 B1 | | 10/2001 | Kenney et al. |
| 6,339,030 B1 | | 1/2002 | Constant et al. |

FOREIGN PATENT DOCUMENTS

| | | |
|---|---|---|
| WO | WO 01/32799 A1 | 5/2001 |
| WO | WO 01/81079 A1 | 11/2001 |

OTHER PUBLICATIONS

Mark et al., Encyclopedia of Polymer Science and Engineering, Wiley–Interscience, 1986, vol. 4, pp. 288–289.*
Zimmerman et al., "High refractive index films of polymer nanocomposite". J. Mater. Res., vol. 8, No. 7, pp. 1742–1748, Jul. 1993.
Yang et al., "Hierarchically Ordered Oxides", Science, vol. 282, pp. 2244–2246, Dec. 18, 1998.
International Search Report (PCT/US02/02054) dated May 17, 2002.
Watanabe et al., "Polymer arrayed–waveguide grating multiplexer with wide tuning range", Electronics Letters, vol. 33, No. 18, Aug. 28, 1997, pp. 1547–1548.

* cited by examiner

*Primary Examiner*—Robert Dawson
*Assistant Examiner*—Kuo-Liang Peng
(74) *Attorney, Agent, or Firm*—Patterson, Thuente, Skaar & Christensen, P.A.; Peter S. Dardi; David Kleinsmith

(57) ABSTRACT

Inorganic particle/polymer composites are described that involve chemical bonding between the elements of the composite. In some embodiments, the composite composition includes a polymer having side groups chemically bonded to inorganic particles. Furthermore, the composite composition can include chemically bonded inorganic particles and ordered copolymers. Various electrical, optical and electro-optical devices can be formed from the composites.

121 Claims, 23 Drawing Sheets

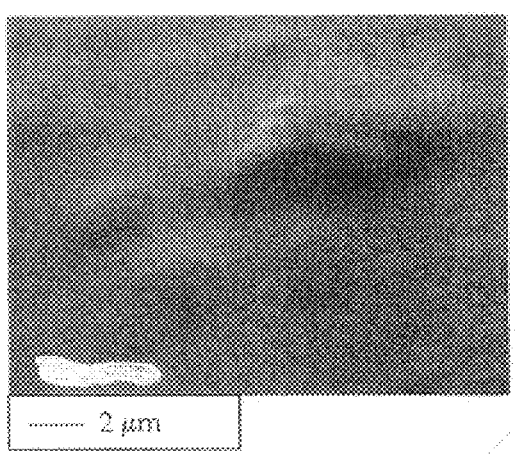
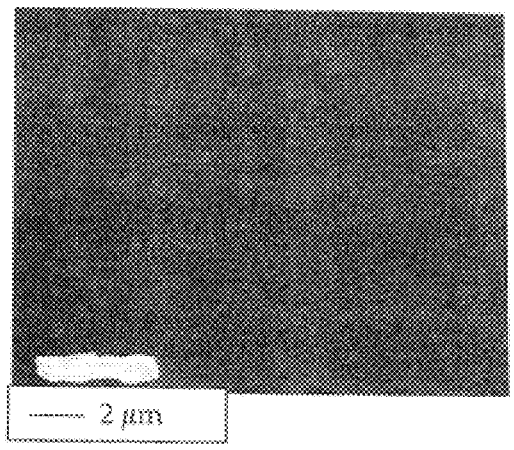
Fig. 37                                  Fig. 35

POLYMER-INORGANIC PARTICLE COMPOSITES

CROSS REFERENCE TO RELATED APPLICATIONS

This application claims priority to U.S. Provisional Application. Ser. No. 60/265,169 filed on Jan. 26, 2001, entitled "Polymer-Inorganic Particle Composites," incorporated herein by reference.

BACKGROUND OF THE INVENTION

The invention relates to composites combining inorganic particles and polymers. The invention further relates to inorganic particles that are functionalized for chemical bonding to other compounds, particularly to polymers.

Advances in a variety of fields have created a demand for many types of new materials. In particular, a variety of chemical powders can be used in many different processing contexts. Specifically, inorganic powders can be used in the production of electronic devices, such as flat panel displays, electronic circuits and optical and electro-optical materials.

Similarly, technological advances have increased the demand for improved material processing with strict tolerances on processing parameters. As miniaturization continues even further, material parameters will need to fall within stricter tolerances. Current integrated circuit technology already requires tolerances on processing dimensions on a submicron scale. Self-assembly approaches have been developed to provide additional options for the application of very thin films of materials. However, self-assembly approaches generally have been limited with respect to the types of materials that can be deposited by a particular approach.

The consolidation or integration of mechanical, electrical and optical components into integral devices has created further demands on material processing. Therefore, there is considerable interest in the formation of specific compositions applied to substrates to perform specific functions. In order to form optical devices with high quality optical coatings from these materials, the coatings must be highly uniform.

Composite materials can be used to combine desirable properties of different materials to obtain improved materials. Alternatively, composite materials can be formed to capture improved or more flexible processing capabilities associated with one material with desirable properties of another material. Thus, in the composite materials, desirable properties of one material can be incorporated into a wider range of structures based on the processing capabilities enabled by another component of the composite. For composites to be useful in certain applications the composites must be structurally stable.

SUMMARY OF THE INVENTION

In a first aspect, the invention pertains to a composite composition comprising a polymer having side groups, chemically-bonded to inorganic particles. Polymers broadly include oligomers.

In another aspect, the invention pertains to a composite composition comprising inorganic particles chemically bonded to a polymer through a linkage comprising a plurality of functional groups, the polymer selected from the group consisting of polyamides, polycarbonates, polyimides, polyphosphazenes, polyurethanes, polyacrylates, polyacrylamides, heterocyclicpolymers, polysiloxanes, polyacrylonitrile, polyacrylic acid, polyvinyl alcohol, polyvinyl chloride, conjugated polymers, aromatic polymers, electrically conducting polymers and mixtures thereof. The polymers possess functional side groups and/or terminal sites that can be chemically bonded with the inorganic particles, which generally are functionalized by bonding with a linker compound.

Also, the invention pertains to a composite composition comprising chemically bonded inorganic particles and polymer selected from the group consisting of polyamides, polycarbonates, polyimides, polyphosphazenes, polyurethanes, heterocyclic polymers, polysiloxanes, polyacrylonitrile, polyacrylic acid, polyvinyl alcohol, polyvinyl chloride, conjugated polymers, aromatic polymers, electrically conducting polymers and mixtures thereof. The polymer is chemically bonded to the inorganic particle at a terminal site of a polymer chain.

In a further aspect, the invention pertains to a composite composition comprising a polymer chemically bonded to inorganic particles, wherein the inorganic particles comprise a metal.

In addition, the invention pertains to a collection of metal/metalloid oxide or metal/metalloid nitride particles that are chemically bonded through a chemical linkage comprising an amine group, an amide group, a sulfide group, a disulfide group, an alkoxy group, a ester group, an acid anhydride group. The linkage is chemically bonded with a polymer.

Furthermore, the invention pertains to a composite composition comprising chemically bonded inorganic particles sand blends of distinct polymers.

In additional aspects, the invention pertains to a structure comprising a surface and a composite localized within boundaries on the surface. The composite comprises inorganic particles bonded to a polymer.

In other aspects, the invention pertains to a method for forming chemically bonded polymer inorganic particle composites. The method comprises binding side chain functional groups of polymer units to functional groups of a linker compound bonded to the inorganic particles.

In additional aspects, the invention pertains to an optical device comprising a composite. The composite comprises a polymer and inorganic particles chemically bonded to the polymer.

In further aspects, the invention pertains to a method for forming a device on a solid substrate. The method comprises associating a composite with the solid substrate. The composite comprises a polymer chemically bonded with an inorganic particle.

BRIEF DESCRIPTION OF THE DRAWINGS

FIG. 35 is a scanning electron micrograph of the composite sample in FIG. 34 at a higher magnification.

FIG. 37 is a scanning electron micrograph of the composite sample in FIG. 36 at a higher magnification.

DETAILED DESCRIPTION OF THE ILLUSTRATIVE EMBODIMENTS

Figure 1:
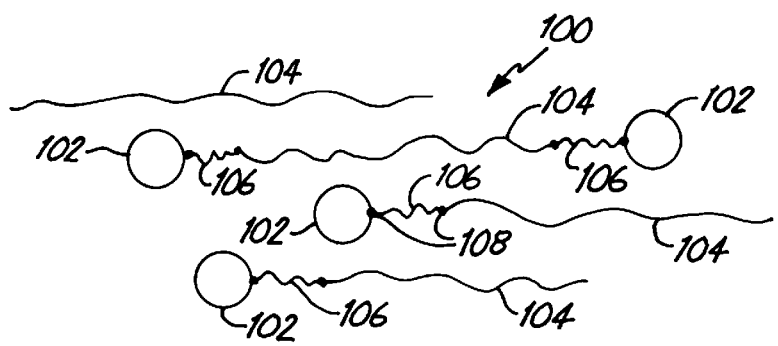
FIG. 1 is a schematic diagram of an embodiment of a polymer/inorganic particle composite.

Composite or hybrid materials generally are formed by chemically bonding a linker compound with both an inorganic nanoparticle and a monomer/polymer unit, although in some embodiments, the polymer is directly bonded to the inorganic particle. Through the use of the linker compound, stable, uniform polymer-inorganic particle composites can be formed with highly dispersed inorganic particles. Specifically, high particle loadings can be achieved without agglomeration of the particles, provided that the particles are functionalized with groups that do not easily bond to themselves, which can result in the formation of hard agglomerates. The composite may represent a synergistic effect of the combined component. The advantages of the combination can be structural, electronic or optical.

The composites can be formed as layers on a substrate for the formation of a variety of useful devices, especially optical devices and photonic crystals. Similarly, the composites can be localized into specific devices, for example, by self-assembly with appropriate localization mechanisms. Alternatively, the composites can be formed into free standing structures, such as fibers.

The composites, thus, include a monomer/polymer component, inorganic particles, and linker compounds that bridge the inorganic particles and the monomer/polymer. In the case of monomer units being joined to the linker compound, a polymer is formed with the formation of the composite. For simplicity in notation, the monomer/polymer unit joined with the linker and assembled into the composite will be referred .to generally as a polymer, although it is recognized that in some cases the unit can be a monomer or polymer, such as a dimer, trimer or larger polymer structures.

A range of polymers are suitable for incorporation into the composites, including both organic. polymers and inorganic polymers, such as polysiloxanes. If the polymers are formed prior to reacting with the functionalized inorganic particles, the molecular weights of the polymers can be selected to vary to properties of the resulting composite. The polymer is selected or synthesized to include appropriate functional groups to covalently bond with functional groups of the linker compound.

The linker compounds have two or more functional groups. One functional group of the linker is suitable for chemical bonding to the inorganic particles. Chemical bonding is considered to broadly cover bonding with some covalent character with or without polar bonding and can have properties of ligand-metal bonding along with various degrees of ionic bonding. The functional group is selected based on the composition of the inorganic particle, as described further below. Another functional group of the linker is suitable for covalent bonding with the polymer. Covalent bonding refers broadly to covalent bonds with sigma bonds, pi bonds, other delocalized covalent bonds and/or other covalent bonding types, and may be polarized bonds with or without ionic bonding components and the like. Convenient linkers include functionalized organic molecules.

In some embodiments, the polymer incorporates the inorganic particles into the polymer network. This can be performed by reacting functional group of the linker compound with terminal groups of a polymer molecule. Alternatively, the inorganic particles can be present during the polymerization process such that the functionalized inorganic particles are directly incorporated into the polymer structure as it is formed. In other embodiments, the inorganic particles are grafted onto the polymer by reacting the linker functional groups with functional groups on polymer side groups. In any of these embodiments, the surface modified/ functionalized inorganic particles can crosslink the polymer if there are sufficient linker molecules, i.e., enough to overcome energetic barriers and form at least two or more bonded links to the polymer. Generally, an inorganic particle will have many linkers associated with the particle. Thus, in practice, the crosslinking depends on the polymer-particle arrangement, statistical interaction of two crosslinking groups combined with molecular dynamics and chemical kinetics.

The inorganic particles can be incorporated at a range of loadings into the composite. Composites with low particle loadings can be produced with high uniformity. In addition, high inorganic particle loadings of up to about 50 weight percent or greater can be achieved with well dispersed particles. In addition, the amount the linker compounds bonded to the inorganic particles can be adjusted to vary the degree of crosslinking obtained with the polymer.

The inorganic particles generally include metal or metalloid elements in their elemental form or in compounds. Specifically, the inorganic particles can include, for example, elemental metal or elemental metalloid, i.e. un-ionized elements, metal/metalloid oxides, metal/metalloid nitrides, metal/metalloid carbides, metal/metalloid sulfides or combinations thereof. Metalloids are elements that exhibit chemical properties intermediate between or inclusive of metals and nonmetals. Metalloid elements include silicon, boron, arsenic, antimony, and tellurium. Preferred particles have an average diameter of less than about 500 nanometers (nm). Suitable nanoparticles can be formed, for example, by flame synthesis, combustion, or sol gel approaches. Preferred methods for synthesizing the particles include laser pyrolysis in which light from an intense focused source drives the reaction to form the particles. Laser pyrolysis is useful in the formation of particles that are highly uniform in composition, crystallinity and size.

To form the desired composites, the inorganic particles are modified on their surface by chemical bonding to one or more linker molecules. The ratio of linker composition to inorganic particles preferably is at least one linker molecular per inorganic particle. The linker molecules surface modify the inorganic particles, i.e., functionalize the inorganic particles. While the linker molecules bond to the inorganic particles, they are not necessarily bonded to the inorganic particles prior to bonding to the polymers. They can be bonded first to the polymers and only then bonded to the particles. Alternatively, they can bond to the two species simultaneously.

A significant procedure in preferred processes for synthesizing the composites involves the dispersion of the inorganic particles in a liquid. The solvent, pH, ionic strength and other additives can be selected to improve the dispersion of the particles. Better dispersion of the particles and stability of the dispersions helps to reduce agglomeration of the particles in the resulting composite.

During formation or after formation of the particle dispersion, the dispersion is interacted with the linker molecules and/or the polymer. Generally, the linker is soluble in the liquid used to form the inorganic particle dispersion and/or the polymer dispersion so that the linker is homogeneously dissolved when bonding from solution. Conditions for the combined particle dispersion and polymer dispersion/ solution should be suitable for the formation of bonds between the linker, the inorganic particles and the polymer. The order for adding the linker to the inorganic particles and the polymer can be selected to achieve the desired processing effectiveness. Once sufficient time has passed to complete the bonding between the components of the composite, the composite can be processed further.

Once formed, the polymer-inorganic particle composite can be transferred to another solvent or removed from the solvent. The composite can be molded, extruded, cast or otherwise processed using polymer processing technology. to form various shapes of materials. In addition, the composite can be coated from a solvent based slurry, spin coated or the like to form a coating of the composite. Any solvent can be removed following the formation of a coating. The coatings can be structured using standard mask techniques. In addition, self-assembly techniques can take advantage of the properties of the components of the composite to assist with the formation of structures on a substrate, as described further below.

Since a wide range of inorganic particles and polymers can be incorporated into the composites described herein, the composites are suitable for a wide range of applications. In particular, the composite materials are useful in the optical and electronics fields. For example, if the inorganic particles have a high index-of-refraction, a variety of optical devices or optical coatings can be formed over wide range and controllable values of index-of-refraction. For example, the composites can be used to form high index-of-refraction coatings on optical fibers. High index-of-refraction materials are desirable to control light propagation. The index-of-refraction of the composite can be controlled by adjusting particle loading.

Other composites of inorganic particles and polymers have been proposed for specific applications. For example, U.S. Pat. No. 5,698,309 to Dallmann et al., entitled "Molded Bodies Made of Polyester Containing Covalent-Bonded Oxide Particles," incorporated herein by reference, discloses molded products including a polyester polymer with oxide particles. Similarly, U.S. Pat. No. 5,494,949 to Kinkel et al., entitled "Surface-Modified Oxide Particles And Their Use As Fillers An Modifying Agents In Polymer Materials," incorporated herein by reference, disclose polyester-oxide particle composites. In addition, U.S. Pat. No. 5,965,299 to Khan et al., entitled "Composite Electrolyte Containing Surface Modified Fumed Silica," incorporated herein by reference, discloses a solid lithium electrolyte includes a composite of vinyl polymers and silicon oxide particles. The types of polymers, inorganic particles, composite structure and/or the types of linkages in these patents differ from the corresponding composites and components thereof described in various embodiments herein. In addition, different applications and processing approaches have been found for polymer/inorganic particle composites.

Polymer And Inorganic Particle Composites

The polymer-inorganic particle composites described herein include inorganic particles bonded to a polymer, preferably through a linker compound. The linker compound is a multifunctional compound, for example, a bifunctional compound, that chemically bonds to both the inorganic particle and the polymer. The chemical bonding between the polymer and the linker generally is covalent. The chemical bonding between the linker and the inorganic surface of the particle generally involves a bond of a functional group with the metal atom along with possible involvement of other atoms in the inorganic composition.

After bonding of the linker to both the polymer and the inorganic particle, a linkage is formed involving a resulting functional group joining the linker compound to the polymer and a second resulting functional group joining the linker compound with the inorganic particle. The resulting or product functional groups are the reaction products of the reactions involving the initial linker functional groups. Thus, the initial presence of a linker can be identified in the resulting composite by the presence of a plurality of resulting functional groups in the linkage between the polymer and the inorganic particle. The character of the initial linker compound functional groups may or may not be uniquely identifiable in the final composite based on the character of the resulting functional group. More than two functional groups can be found on a linkage, for example, if a plurality of linker molecules are involved, if a linker includes more than two functional groups or if the polymer side chain initially includes more than one functional group.

The inorganic particles can be bonded through the linker compound into the polymer structure, or the particles can be grafted to polymer side groups. The bonded inorganic particles can, in most embodiments, crosslink the polymer. Specifically, most embodiments involve star crosslinking of a single inorganic particle with several polymer groups. The structure of the composite can generally be controlled by the density of linkers, the length of the linkers, the chemical reactivity of the coupling reaction, the density of the reactive groups on the polymer as well as the loading of particles and the molecular weight range of the polymer (i.e., monomer/polymer units). In alternative embodiments, the polymer has functional groups that bond directly with the inorganic particles, either at terminal sites or at side groups. In these alternative embodiments, the polymer includes functional groups comparable to appropriate linker functional groups for bonding to the inorganic particles.

The composites preferably have stably integrated inorganic particles well dispersed throughout the composite structure. In this way, high loadings of inorganic particles can be achieved without significant agglomeration of the particles within the composite. Stable composites can be produced with loadings of greater than about 50 weight percent of inorganic particles and can be greater than about 80 weight percent. A person of ordinary skill in the art will recognize that particle loadings below these specific values are covered within the disclosure herein and are appropriate cut-off values for a range of loadings. Low loadings, such as one or two percent or less, can be desirable for some applications.

To form high index-of-refraction materials, high particle loadings are generally used. The index-of-refraction of the composite is expected to be approximately a linear combination by the volume ratios of index-of-refraction of the inorganic particles and the polymer. The use of nanoparticles has the advantage for optical materials of higher transparency and reduced scattering of light relative to larger inorganic I particles, especially effective in reducing scattering in the infrared portion of the electromagnetic spectrum including wavelengths of about 0.8 microns to about 5.0 microns.

Various structures can be formed based on the fundamental idea of forming the chemically bonded polymer/inorganic particle composites. The structures obtained will generally depend on the relative amounts of polymer/monomers, linkers and inorganic particles as well as the synthesis process itself. Linkers may be identified also as coupling agents or crosslinkers. A first composite structure is shown in FIG. 1. The composite 100 includes inorganic particles 102, polymer molecules 104 and linkers 106. In this embodiment, the inorganic particles have roughly one linking per particle, which are bonded to the ends of the polymer molecules. This embodiment is shown for a simple depiction of the principles, although in practice, generally many linkers are bonded to each particle to obtained desired levels of polymer bonding to the particles. Chemical/covalent bonds 108 between moieties are indicated with dots.

In the structure shown in FIG. 1, each inorganic particles is bonded to roughly one polymer chain, although there generally will be at least a small proportion of the inorganic particles bonded to no polymer chains or more than one polymer chain. Even if there is on average one linker per inorganic particle, the structure of FIG. 1 may not be formed. Depending on the conditions during the combination of the linker to the inorganic particles, some inorganic particles can be bonded to two or more linkers while other inorganic particles may not be bonded to any linkers.

In addition, the relative amounts of polymer and surface modified particles influences whether a polymer molecule is bonded on both ends or only on a single end with an inorganic molecule and linker. For example, if the polymers are present in significantly higher equivalence/molarity, most polymer molecules will have at most one bonded inorganic particles. Again, however, the amount of mixing and other processing parameters can influence the ultimate structure.

Figure 2:
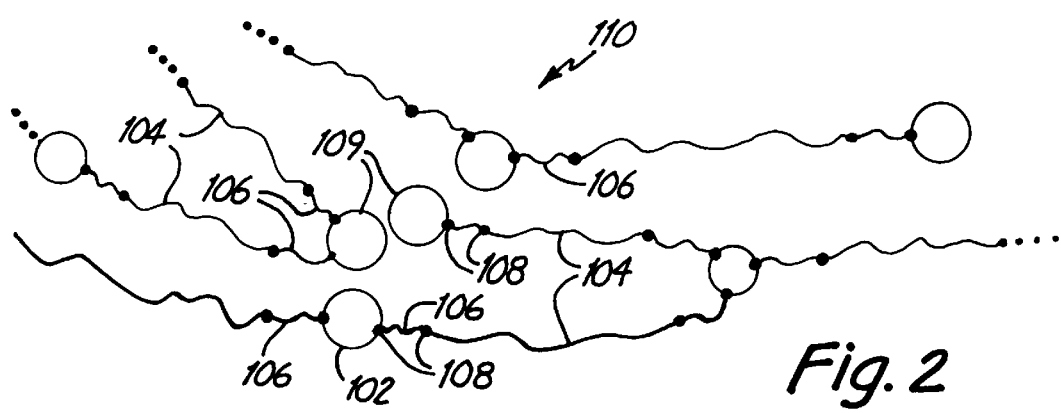
FIG. 2 is a schematic diagram of an alternative embodiment of a polymer/inorganic particle composite with a low degree of crosslinked network.

In general, a large number of crosslinking molecules are bonded to each of the inorganic particles. With a reasonable portion of the linkers bonding to a polymer, the inorganic particles with bonded linkers crosslink the polymers. For example, a structure involving crosslinked inorganic particles is shown in FIG. 2. In this embodiment, composite 110 includes a majority of the inorganic particles 102 that are bonded to a plurality of linkers 106. The linker modified inorganic particles then function to crosslink polymer molecules 104. A representative set of component labels are shown. Ellipsis marks are used to indicate continuing crosslinked structure.

The major difference between the structure of FIG. 1 and the structure of FIG. 2 involves the relative amount of linking. The structure in FIG. 1 has approximately one linker molecule per inorganic particle, while the structure in FIG. 2 has more than one linker per inorganic particle. As noted above, even if there are roughly one linker per inorganic particle, the surface modified inorganic particles can crosslink the polymer if the surface modification of the particles is performed under conditions in which many particles are bonded with more than one linker molecule while other particles are bonded to no linkers. The detailed structure of a crosslinked polymer, as shown in FIG. 2, will depend on the relative amounts of linker, inorganic particles, and polymer molecules as well as the size of the linker, the chemical reactivity of the linker and the processing conditions. The linker can have more than two functional groups, such that the linker can also crosslink the composite.

Figure 3:
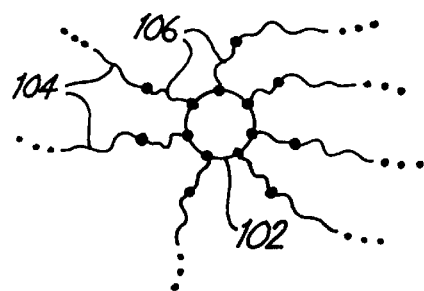
FIG. 3 is a schematic diagram depicting an inorganic particles bonded to a plurality of linkers to form a star linkage in a composite.

In preferred embodiments, the linker is applied to form at least a significant fraction of a monolayer on the surface of the particles. In particular, preferably at least about 20% of a monolayer is applied to the particles, and generally at least about 40% of a monolayer is applied. A monolayer is calculated based on measured surface area of the particles and an estimate of the molecular radius of the linker based on accepted values of the atomic radii. With these high linker coverages, the linkers presumably form a highly crosslinked structure with the polymers. At each inorganic particle, star crosslinking structures are formed. This is shown schematically in FIG. 3, in which inorganic particle 102 is bonded to a number of linkers 106 that are in turn bonded to polymers 104. A highly crosslinked structure results around the star linkages at the inorganic particles. These structures are expected to be related also to low particle concentration or polymer growth initiated from the particle surface.

Figure 4:
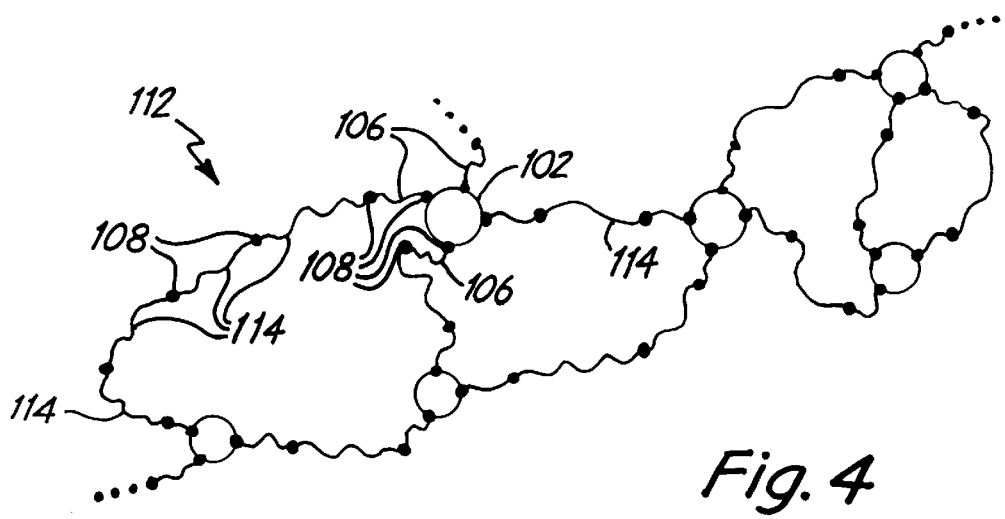
FIG. 4 is a schematic diagram of another alternative embodiment of a polymer/inorganic particle composite with a high degree of crosslinking.

Another composite structure 112 is shown in FIG. 4 in which the polymerization takes place in the presence of the surface modified inorganic particles. The particles become an integral part of the polymer structure. A plurality of different monomer units can be used, such that a copolymer is formed. Using appropriately selected functional groups and/or polymerization conditions to form sequential polymerization, block copolymers can be formed. Block copolymer structures are described further below. In the embodiment in FIG. 4, the relative amount of monomers 114 relative to the inorganic particles 102 and linkers 106 determines the precise structure. As shown in FIG. 4, monomers 114 bond to other monomers 114 or to linkers 106. In alternative embodiments, the monomers can include functional groups that bond to just linker molecules and not to other monomers. In such an alternative structure, the surface modified inorganic particles are integral to the formation of a polymer structure in which the inorganic particles and linkers function as repeat units within the polymer.

The degree of crosslinking in composite 112 of FIG. 4. depends on the relative amount of linker compared with inorganic particles and monomer. In addition, the monomers can include the capability to crosslink between themselves by having the capability of forming three or more covalent bonds. Thus, a variety of structures can be formed. In FIG. 4 only a representative sample of label numbers are shown for clarity, and ellipsis marks are used to indicate further structure.

Figure 5:
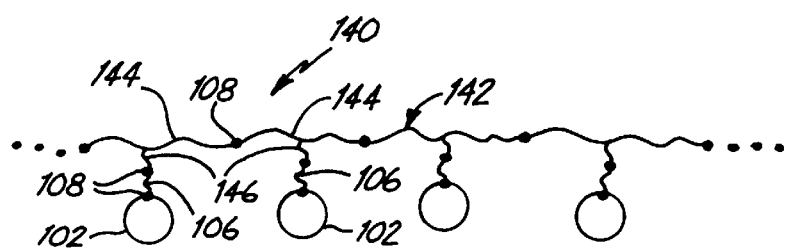
FIG. 5 is a schematic diagram of an embodiment of a polymer/inorganic particle composite with particles tethered to a polymer chain.

An embodiment of a composite with grafted inorganic particles is shown in FIG. 5. Composite 140 includes polymer 142 with monomers 144 having functional side groups 146. Side groups 146 are covalently bonded to linkers 106 that are chemically bonded to inorganic particles 102. Of course, if insufficient quantities of surface modified inorganic particles are available or if the frequency of the side groups is high, as with polyacrylic acid, all side groups 146 may not be bonded to linkers 106 attached to inorganic particles 102.

Figure 6:
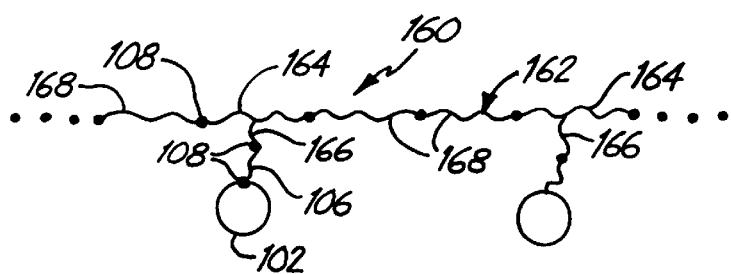
FIG. 6 is a schematic diagram of a copolymer with partial tethered embodiment capability of a polymer/inorganic particle composite.

An alternative embodiment is shown in FIG. 6. In the embodiment in FIG. 6, composite 160 includes a copolymer 162 comprising monomers 164 with functional side groups 166 and monomers 168 without functional side groups. The degree of grafting with inorganic particles can be controlled by the relative amounts of monomers with functional side groups relative to the total number of monomers.

Figure 7:
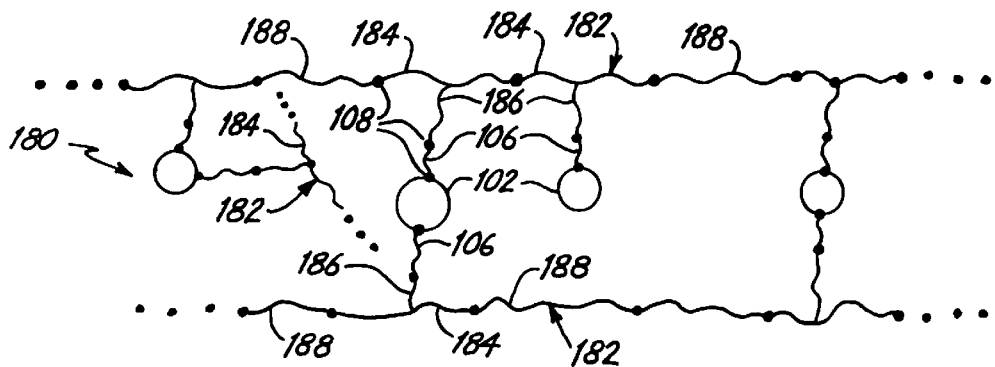
FIG. 7 is a schematic diagram of an embodiment of a polymer/inorganic particle composite with crosslinked tethered particles.

If the amount of linker molecules are increased, the grafted inorganic particles can also form crosslinks between polymer chains. Referring to FIG. 7, composite 180 includes polymer molecules 182 with monomers 184 having functional side groups 186 and monomers 188 without functional side groups. Inorganic particles 102 with linkers 106 can be crosslinked between two functionalized side groups. The degree of crosslinking depends on the relative amounts of all of the constituents.

Figure 8:
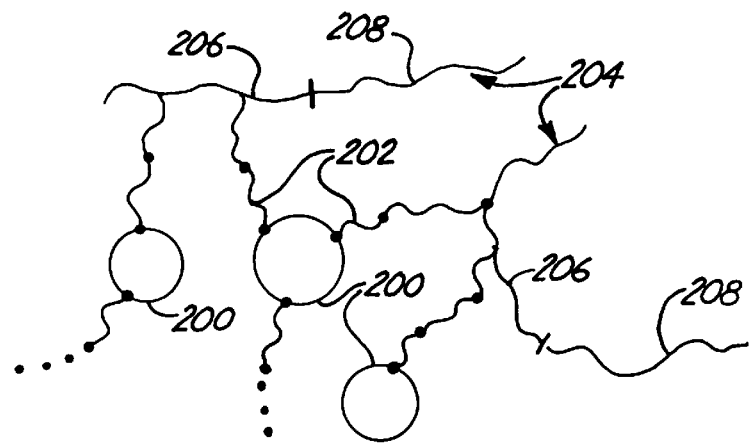
FIG. 8 is a schematic diagram depicting an inorganic particle forming a linkage through linker compounds with one block of a block copolymer.

In all of the structures of FIGS. 1–7, the ability exists to form block copolymers. For example, the polymer chains bonding to the linkers can themselves be block copolymers. Thus, the resulting structure is a block copolymer tethered with inorganic particles. In one form, the inorganic particles bonded to the linkers can crosslink the block copolymers with star linkages of FIG. 3. Such a block copolymer is shown in FIG. 8. Inorganic particles 200 are bonded to linkers 202. Linkers 202 are bonded to block copolymers 204 with blocks 206, 208.

As shown in FIG. 8, the inorganic particles crosslink the composite by bonding to the polymers through side groups of the copolymers. Generally, the inorganic particles can bond to side groups of only one or of both blocks of the polymer. As shown in FIG. 8, the inorganic polymers are only grafted to block 206 of copolymers 204.

In other alternative embodiments, each block can bond to different types of modified inorganic particles. For example, one type of inorganic particle can be bonded to one linker molecule while a second type of inorganic particle is bonded to a second type of linker. One linker has an appropriate functional group to bond with one block of the block copolymer, and the second linker has an appropriate functional group to bond with the other block of the block copolymer.

Figure 9:
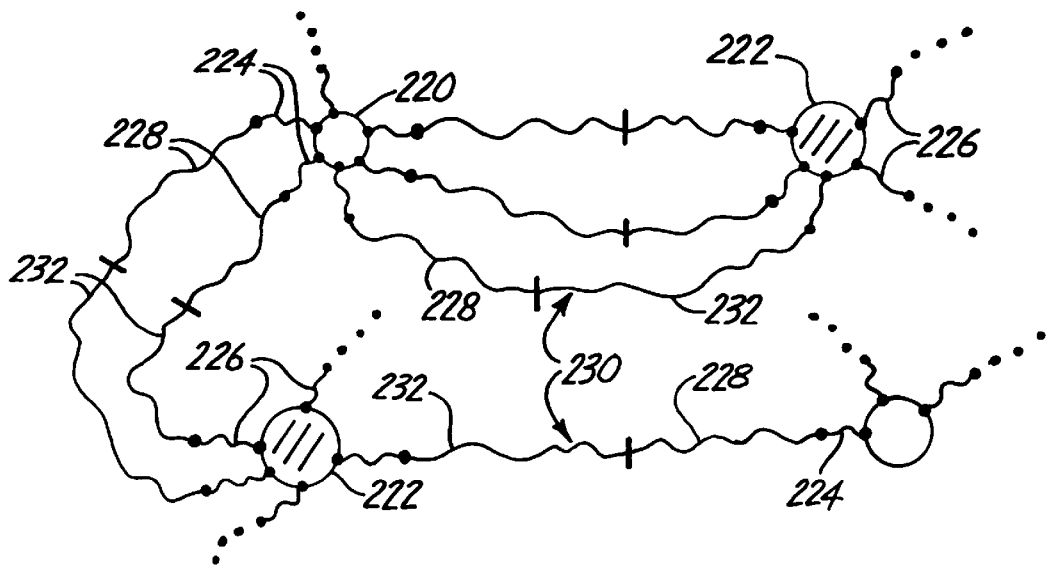
FIG. 9 is a schematic diagram depicting a composite formed with two types of inorganic particles forming linkages to different blocks of a diblock copolymer.

Such a copolymer is shown in FIG. 9. The composite includes a first type of inorganic particle 220 and a second type of inorganic particle 222. The different types of particles can differ by composition, crystal structure and/or physical properties. Inorganic particles 220 are bonded to first linkers 224, and inorganic particles 222 are bonded to second linkers 226. Linkers 224 are bonded to a first block 228 of block copolymer 230, and linkers 226 are bonded to a second block 232 of block copolymer 230.

If the chemical compositions of the different blocks are selected to be chemically different with respect to charge, polarity, hydrophobicity, and the like, the blocks may tend to segregate in solution. This segregation is a form of self-organization. Self-organization properties can be exploited in performing self-assembly.

The difference in properties between the various embodiments will depend on the details of the chemical moieties, the relative amounts of the constituents and the structure of the composite. Representative embodiments of the composites have been described. Clearly, other variations in composite structures incorporating various features can be constructed by combining and/or varying the features of the various composite structures described. The precise composite structure will depend on the nature of the polymer and linker, the relative amounts of the components and the processing conditions.

The inorganic particles are selected to yield desired properties for the resulting composite materials. For example, the inorganic particles can be selected based on, for example, their optical properties, electrical conductivity, electronic/magnetic properties, thermal properties, such as thermal expansion, luminescence or catalytic activity. Suitable inorganic particles include, for example, metal/metalloid particles, metal/metalloid oxides, metal/metalloid nitrides, metal/metalloid carbides, metal/metalloid sulfides, metal/metalloid phosphates and mixtures thereof. Details about preferred properties and approaches for synthesizing preferred inorganic particles are presented in the following section.

Suitable polymers include organic polymers, silicon based polymers and other inorganic polymers. Many different types of polymers are suitable as long as they have terminal groups and/or preferably side groups capable of bonding to a linker. Suitable organic polymers include, for example, polyamides (nylons), polyimides, polycarbonates, polyurethanes, polyacrylonitrile, polyacrylic acid, polyacrylates, polyacrylamides, polyvinyl alcohol, polyvinyl chloride, heterocyclic polymers, polyesters and modified polyolefins. Composites formed with nylon polymers, i.e., polyamides, and inorganic nanoparticles can be called Nanonylon™. Suitable polymers include, conjugated polymers within the polymer backbone, such as polyacetylene, and aromatic polymers within the polymer backbone, such as poly(p-phenylene), poly(phenylene vinylene), polyaniline, polythiophene, poly(phenylene sulfide), polypyrrole and copolymers and derivatives thereof. Some polymers can be bonded to linkers at functional side groups. The polymer can inherently include desired functional groups, can be chemically modified to introduce desired functional groups or copolymerized with monomer units to introduce a portions of desired functional groups. Electrically conducting polymers can be particularly useful for certain applications. Polyacetylene becomes an electrical conductor upon doping with electron acceptors, such as halogens, or electron donors, such as alkali metals. Mixtures of polymers can also be used, although in many embodiments one of the above polymers is present in at least about 50% by weight, optionally at least about 75% by weight and optionally at least about 90% by weight of the polymer/monomer composition. Similarly, some composites include only a single polymer/monomer composition bonded into the composite. Within a crosslinked structure, a polymer is identifiable by 3 or more repeat units along a chain, except for hydrocarbon chains which are not considered polymers unless they have a repeating side group or at least about 50 carbon—carbon bonds within the chain.

Preferred silicon-based polymers include polysilanes and polysiloxane (silicone) polymers, such as poly(dimethylsiloxane) (PDMS). Polysiloxanes are particularly suitable for forming composites with grafted inorganic particles. To form these grafted composites, the polysiloxanes can be modified with amino and/or carboxylic acid groups. Polysiloxanes are desirable polymers because of their transparency to visible and ultraviolet light, high thermal stability, resistance to oxidative degradation and its hydrophobicity. Other inorganic polymers include, for example, phosphazene polymers (phosphonitrile polymers).

Polyamides are desirable since unreacted carboxylic acid groups or amine groups can be used to covalently bond the polymer to the linker compound. Various polyamides are commercially available and have desirable mechanical properties, such as the Nylon 6. Polyimides are of interest because of their excellent structural and thermal properties. In particular, some polyimides have very high thermal stability. Some fluorinated polyimides are curable under ultraviolet light for low temperature processing. In addition, some polyimides are at least partly transparent to infrared light. In addition, polyimides can have liquid crystal properties. Polyimides can bond to various functional groups of linker either directly or through functional side groups.

Vinyl polymers are attractive because of their low cost and flexibility with respect to selecting desired side group properties, due to the many different vinyl polymers available. Vinyl polymers can be synthesized by radical initiation. Acrylic polymers are of particular interest because of their transparency and side group functionalities. In addition, acrylic polymers can be copolymerized into block copolymers, which can be used to form organized nanoscale structures.

The linkers are polyfunctional molecules that have at least one functional group that bonds to the inorganic particles and at least one functional group; that bonds to the polymer. The functional groups are preferably positioned in the linker molecule such that there is no stearic interference with the bonding to both the inorganic particle and the polymer. Thus, the linker provides bonding capability that leads to the complex formation. In preferred embodiments, the functional groups intended to bind with the inorganic particles are chemically and functionally distinct from the functional groups that bind to the polymer such that the linkers do not just crosslink polymers or inorganic particles together without forming the composite. The linker can include more than two functional groups such that the linker can form chemical crosslinks within the composite. Also, the linker should be treated in a mode that reduces, preferably as much as possible, self-condensation of the linker. This is particularly relevant in the case of multi-alkoxy or multi-chloro silanes that can polycondense to form oligomeric or resin-like crosslinkers.

The frame of the linker supporting the functional groups is generally an organic compound, although it may also include silyl and/or siloxy moieties. The organic linker frame can comprise any reasonable organic moiety including, for example, linear or branched carbon chains, cyclical carbon moieties, saturated carbon moieties, unsaturated carbon moieties, aromatic carbon units, halogenated carbon groups and combinations thereof. The structure of the linker can be selected to yield desirable properties of the composite. For example, the size of the linker is a control parameter that may effect the periodicity of the composite and the self-organization properties.

Appropriate functional groups for binding with the polymer depend on the functionality of the polymer. Generally, the functional groups of the polymers and the linker can be selected appropriately based on known bonding properties. For example, carboxylic acid groups bond covalently to thiols, amines (primary amines and secondary amines) and alcohol groups. As a particular example; nylons can include unreacted carboxylic acid groups, amine groups or derivatives thereof that are suitable form covalently bonding to linkers. In addition, for bonding to acrylic polymers, a portion of the polymer can be formed from acrylic acid or derivatives thereof such that the carboxylic acid of the acrylic acid can bond with amines (primary amines and secondary amines), alcohols or thiols of a linker. The functional groups of the linker can provide selective linkage either to only particles with particular compositions and/or polymers with particular functional groups. Other suitable functional groups for the linker include, for example, halogens, silyl groups ($-SiR_{3-x}H_x$), isocyanate, cyanate, thiocyanate, epoxy, vinyl silyls, silyl hydrides, silyl halogens, mono-, di- and trihaloorganosilane, phosphonates, organometalic carboxylates, vinyl groups, allyl groups and generally any unsaturated carbon groups ($-R'-C=C-R''$), where R' and R'' are any groups that bond within this structure. Selective linkage can be useful in forming composite structures that exhibit self-organization.

Upon reaction of the polymer functional groups with the linker functional groups, the identity of initial functional groups is merged into a resultant or product functional group in the bonded structure. A linkage is formed that extends from the polymer. The linkage extending from the polymer can include, for example, an organic moiety, a siloxy moiety, a sulfide moiety, a sulphonate moiety, a phosphonate moiety, an amine moiety, a carbonyl moiety, a hydroxyl moiety, or a combination thereof. The identity of the original functional groups may or may not be apparent depending on the resulting functional group. The resulting functional groups generally can be, for example, an ester group, an amide group, an acid anhydride group, an ether group, a sulfide group, a disulfide group, an alkoxy group, a hydrocarbyl group, a urethane group, an amine group, an organo silane group, a hydridosilane group, a silane group, an oxysilane group, a phosphonate group, a sulphonate group or a combination thereof.

If a linker compound is used, one resulting functional group generally is formed where the polymer bonds to the linker and a second resulting functional group is formed where the linker bonds to the inorganic particle. At the inorganic particle, the identification of the functional group may depend on whether particular atoms are associated with the particle or with the functional group. This is just a nomenclature issue, and a person of skill in the art can identify the resulting structures without concern about the particular allocation of atoms to the functional group. For example, the bonding of a carboxylic acid with an inorganic particle may result in a group involving bonding with a non-metal/metalloid atom of the particle; however, an oxo group is generally present in the resulting functional group regardless of the composition of the particle. Ultimately, a bond extends to a metal/metalloid atom.

Appropriate functional groups for bonding to the inorganic particles depends on the character of the inorganic particles. U.S. Pat. No. 5,494,949 to Kinkel et al., entitled "SURFACE-MODIFIED OXIDE PARTICLES AND THEIR USE AS FILLERS AND MODIFYING AGENTS IN POLYMER MATERIALS," incorporated herein by reference, describes the use of silylating agents for bonding to metal/metalloid oxide particles. The particles have alkoxy modified silane for bonding to the particles. For example, preferred linkers for bonding to metal/metalloid oxide particles include $R^1R^2R^3-Si-R^4$, where $R^1$, $R^2$, $R^3$ are alkoxy groups, which can hydrolyze and bond with the particles, and $R^4$ is a group suitable for bonding to the polymer. Trichlorosilicate ($-SiCl_3$) functional groups can react with an hydroxyl group at the metal oxide particle surface by way of a condensation reaction.

Generally, thiol groups can be used to bind to metal sulfide particles and certain metal particles, such as gold, silver, cadmium and zinc. Carboxyl groups can bind to other metal particles, such as aluminum, titanium, zirconium, lanthanum and actinium. Similarly, amines and hydroxide groups would be expected to bind with metal oxide particles and metal nitride particles, as well as to transition metal atoms, such as iron, cobalt, palladium and platinum.

The identity of the linker functional group that bonds with the inorganic particle may also be modified due to the character of the bonding with the inorganic particle. One or more atoms of the inorganic particle are involved in forming the bond between the linker and the inorganic particle. It may be ambiguous if an atom in the resulting linkage originates from the linker compound or the inorganic particle. In any case, a resulting or product functional group is formed joining the linker molecule and the inorganic particle. The resulting functional group can be, for example, one of the functional groups described above resulting from the bonding of the linker to the polymer. The functional group at the inorganic particle ultimately bonds to one or more metal/metalloid atoms.

Inorganic Particles

In general, any reasonable inorganic particles can be used to form the composites. In preferred embodiments, the particles have an average diameter of no more than about one micron. For preferred applications the composition of the particles is selected to impart desired properties to the composite. In particular, for composites with high particle loadings, the inorganic particles contribute significantly to the overall properties of the composite. Thus, in the formation of optical materials for example, the optical properties of both the polymer and the inorganic particles can be significant. It is expected that the index-of-refraction of the composite material is roughly the linear combination based on the volume ratios of the index-of-refractions of the inorganic particles and the polymer.

Preferred particles are formed by laser pyrolysis, which can be used to form a range of submicron particles with extremely uniform properties. Small particles can provide processing advantages with respect to forming small structures and smooth surfaces. In addition, small particles have desirable properties including reduced scattering to lower scattering loss.

A collection of particles of interest generally has an average diameter for the primary particles of less than about 500 nm, preferably from about 2 nm to about 100 nm, alternatively from about 2 nm to about 75 nm, or from about 2 nm to about 50 nm. A person of ordinary skill in the art will recognize that other ranges within these specific ranges are covered by the disclosure herein. Particle diameters are evaluated by transmission electron microscopy. Preferred particles comprise elemental/non-ionic metal/metalloid, a metal/metalloid oxide, a metal/metalloid nitride, a metal/metalloid sulfide, a metal/metalloid carbide or combinations thereof.

The primary particles can have a roughly spherical gross appearance, or they can have rod shapes, plate shapes or other non-spherical shapes. Upon closer examination, crystalline particles generally have facets corresponding to the underlying crystal lattice. Amorphous particles generally have a spherical aspect. Diameter measurements on particles with asymmetries are based on an average of length measurements along the principle axes of the particle.

Because of their small size, the primary particles tend to form loose agglomerates due to van der Waals and other electromagnetic forces between nearby particles. These agglomerates can be dispersed to a significant degree, as described further below. The secondary or agglomerated particle size depends on the subsequent processing of the particles following their initial formation and the composition and structure of the particles. In preferred embodiments, the secondary particles have an average diameter from about 2 nm to about 400 nm, preferably about 2 nm to about 100 nm, alternatively about 2 nm to about 50 nm. A person of ordinary skill in the art will recognize that other ranges within these specific ranges are covered by the disclosure herein.

Even though the particles form loose agglomerates, the nanometer scale of the primary particles is clearly observable in transmission electron micrographs of the particles. The particles generally have a surface area corresponding to particles on a nanometer scale as observed in the micrographs. Furthermore, the particles can manifest unique properties due to their small size and large surface area per weight of material. For example, vanadium oxide nanoparticles can exhibit surprisingly high energy densities in lithium batteries, as described in U.S. Pat. No. 5,952,125 to Bi et al., entitled "Batteries With Electroactive Nanoparticles," incorporated herein by reference.

The primary particles preferably have a high degree of uniformity in size. Laser pyrolysis, as described above, generally results in particles having a very narrow range of particle diameters. Furthermore, heat processing under suitably mild conditions does not alter the very narrow range of particle diameters. With aerosol delivery of reactants for laser pyrolysis, the distribution of particle diameters is particularly sensitive to the reaction conditions. Nevertheless, if the reaction conditions are properly controlled, a very narrow distribution of particle diameters can be obtained with an aerosol delivery system. As determined from examination of transmission electron micrographs, the primary particles generally have a distribution in sizes such that at least about 95 percent, and preferably 99 percent, of the primary particles have a diameter greater than about 40 percent of the average diameter and less than about 160 percent of the average diameter. Preferably, the primary particles have a distribution of diameters such that at least about 95 percent, and preferably 99 percent, of the primary particles have a diameter greater than about 60 percent of the average diameter and less than about 140 percent of the average diameter. A person of ordinary skill in the art will recognize that other ranges within these specific ranges are covered by the disclosure herein.

Furthermore, in preferred embodiments no primary particles have an average diameter greater than about 4 times the average diameter and preferably 3 times the average diameter, and more preferably 2 times the average diameter. In other words, the particle size distribution effectively does not have a tail indicative of a small number of particles with significantly larger sizes. This is a result of the small reaction region and corresponding rapid quench of the particles. An effective cut off in the tail of the size distribution indicates that there are less than about 1 particle in $10^6$ have a diameter greater than a specified cut off value above the average diameter. High particle uniformity can be exploited in a variety of applications.

In addition, the nanoparticles preferably have a very high purity level. The nanoparticles produced by laser pyrolysis are expected to have a purity greater than the reactants because the laser pyrolysis reaction and, when applicable, the crystal formation process tends to exclude contaminants from the particle. Furthermore, crystalline nanoparticles produced by laser pyrolysis have a high degree of crystallinity. Similarly, the crystalline nanoparticles produced by heat processing have a high degree of crystallinity. Impurities on the surface of the particles may be removed by heating the particles to achieve not only high crystalline purity but high purity overall.

Laser pyrolysis is an excellent approach for efficiently producing a wide range of nanoscale particles with a narrow distribution of average particle diameters. In particular, laser pyrolysis can be used to produce a variety of inorganic particles, such as elemental metal/metalloid particles, metal/metalloid oxide particles, metal/metalloid carbide particles, metal/metalloid nitride particles and metal/metalloid sulfide particles. Alternatively, submicron particles can be produced using a flame production apparatus such as the apparatus described in U.S. Pat. No. 5,447,708 to Helble et al., entitled "Apparatus for Producing Nanoscale Ceramic Particles," incorporated herein by reference. Furthermore, submicron particles can be produced with a thermal reaction chamber such as the apparatus described in U.S. Pat. No. 4,842,832 to Inoue et al., "Ultrafine Spherical Particles of Metal Oxide and a Method for the Production Thereof," incorporated herein by reference. In addition, various solution based approaches can be used to produce submicron particles, such as sol gel techniques.

A basic feature of successful application of laser pyrolysis for the production of desirable inorganic nanoparticles is the generation of a reactant stream containing a metal/metalloid precursor compound, a radiation absorber and, generally, a secondary reactant. The secondary reactant can be a source of atoms, such as oxygen, required for the desired product or an oxidizing or reducing agent to drive a desired product formation. A secondary reactant is not needed if the precursor decomposes to the desired product under intense light radiation. Similarly, a separate radiation absorber is not needed if the metal/metalloid precursor and/or the secondary reactant absorb the appropriate light radiation. The reactant stream is pyrolyzed by an intense light beam, generally a laser beam. As the reactant stream leaves the laser beam, the particles are rapidly quenched.

A laser pyrolysis apparatus suitable for the production of commercial quantities of particles by laser pyrolysis has been developed using a reactant inlet that is significantly elongated in a direction parallel to the path of the laser beam. This high capacity laser pyrolysis apparatus is described in U.S. Pat. No. 5,958,348, entitled "Efficient Production Of Particles By Chemical Reaction," incorporated herein by reference. Approaches for the delivery of aerosol precursors for particles by laser pyrolysis is described in copending and commonly assigned U.S. patent application Ser. No. 09/188,670, now U.S. Pat. No. 6,193,936 to Gardner et al., entitled "Reactant Delivery Apparatus," incorporated herein by reference.

Nanoparticles produced by laser pyrolysis can be subjected to additional processing to alter the nature of the particles, such as the composition and/or the crystallinity. For example, the nanoparticles can be subjected to heat processing in a gas atmosphere prior to use. Under suitably mild conditions, heat processing is effective to modify the characteristics of the particles without destroying the nanoscale size or the narrow particle size distribution of the initial particles. For example, heat processing of submicron vanadium oxide particles is described in U.S. Pat. No. 5,989,514 to Bi et al., entitled "Processing Of Vanadium Oxide Particles With Heat," incorporated herein by reference.

Several different types of submicron or nanoscale particles have been produced by laser pyrolysis with or without additional heat processing. These particles generally have a very narrow article size distribution, as described above.

In particular, the production of vanadium oxide nonparticles is described in U.S. Pat. No. 6,106,798 to Bi et al., entitled "Vanadium Oxide Nanoparticles," incorporated herein by reference. Similarly, silver vanadium oxide nanoparticles have been produced, as described in copending and commonly assigned U.S. patent applications Ser. Nos. 09/246,076 to Horne et al., now U.S. Pat. No. 6,225,007 and 09/311,506, now U.S. Pat. No. 6,394,494 to Reitz et al., both entitled "Metal Vanadium Oxide Particles," both of which are incorporated herein by reference.

Also, nanoscale manganese oxide particles have been formed by laser pyrolysis. The production of these particles is described in copending and commonly assigned U.S. patent application Ser. No. 09/188,770 to Kumar et al., entitled "Metal Oxide Particles," incorporated herein by reference. This application describes the production of MnO, $Mn_2O_3$, $Mn_3O_4$ and $Mn_5O_8$.

Furthermore, lithium manganese oxide nanoparticles have been produced by laser pyrolysis along with or without subsequent heat processing, as described in copending and commonly assigned U.S. patent applications Ser. No. 09/188,768 to Kumar et al., entitled "Composite Metal Oxide Particles," and 09/334,203 to Kumar et al., entitled "Reaction Methods for Producing Ternary Particles," and U.S. Pat. No. 6,136,287 to Horne et al., entitled "Lithium Manganese Oxides and Batteries," all three of which are incorporated herein by reference.

The production of silicon oxide nanoparticles is described in copending and commonly assigned U.S. patent application Ser. No. 09/085,514 to Kumar et al., entitled "Silicon Oxide Particles," incorporated herein by reference. This patent application describes the production of amorphous $SiO_2$. The synthesis by laser pyrolysis of silicon carbide and silicon nitride is described in copending and commonly assigned U.S. patent application Ser. No. 09/433,202 to Reitz et al. filed on Nov. 5, 1999, entitled "Particle Dispersions," incorporated herein by reference.

The production of titanium oxide nanoparticles is decribed in copending and commonly assigned, U.S. patent application Ser. No. 09/123,255, now U.S. Pat. No. 6,387,531 to Bi et al., entitled "Metal (Silicon) Oxide/Carbon Composites," incorporated herein by reference. In particular, this application describes the production of anatase and rutile $TiO_2$. The production of aluminum oxide nanoparticles is described in copending and commonly assigned, U.S. patent application Ser. No. 09/136,483 to Kumar et al., entitled "Aluminum Oxide Particles," incorporated herein by reference. In particular, this application disclosed the production of $\gamma$-$Al_2O_3$. Suitable liquid, aluminum precursors with sufficient vapor pressure of gaseous delivery include, for example, aluminum s-butoxide (Al$(OC_4H_9)_3$). Also, a number of suitable solid, aluminum precursor compounds are available including, for example, aluminum chloride ($AlCl_3$), aluminum ethoxide (Al$(OC_2H_5)_3$), and aluminum isopropoxide (Al[OCH(CH$_3$)$_2$]$_3$).

In addition, tin oxide nanoparticles have been produced by laser pyrolysis, as described in copending and commonly assigned U.S. patent application Ser. No. 09/042,227, now U.S. Pat. No. 6,200,674 to Kumar et al., entitled "Tin Oxide Particles," incorporated herein by reference. The production of zinc oxide nanoparticles is described in copending and commonly assigned U.S. patent application Ser. No. 09/266,202 to Reitz, entitled "Zinc Oxide Particles," incorporated herein by reference. In particular, the production of ZnO nanoparticles is described.

The production of iron and iron carbide is described in a publication by Bi et al., entitled "Nanocrystalline $\alpha$-Fe, $Fe_3C$, and $Fe_7C_3$ produced by $CO_2$ laser pyrolysis," J. Mater. Res. Vol. 8, No. 7 1666–1674 (July 1993), incorporated herein by reference. The production of iron oxide nanoparticles is described in U.S. Pat. No. 6,080,337 to Kambe et al., entitled "Tron Oxide Particles," incorporated herein by reference. The production of nanoparticles of silver metal is described in copending and commonly assigned U.S. patent application Ser. No. 09/311,506, now U.S. Pat. No. 6,394,494 to Reitz et al., entitled "Metal Vanadium Oxide Particles," incorporated herein by reference.

The production of iron sulfide ($Fe_{1-x}S$) nanoparticles by laser pyrolysis is described in Bi et al., Material Research Society Symposium Proceedings, vol 286, p. 161–166 (1993), incorporated herein by reference. Precursors for laser pyrolysis production of iron sulfide were iron pentacarbonyl (Fe(CO)$_5$) and hydrogen sulfide (H$_2$S).

Cerium oxide can also be produced using laser pyrolysis. Suitable precursors for aerosol delivery include, for example, cerous nitrate (Ce(NO$_3$)$_3$), cerous chloride (CeCl$_3$) and cerous oxalate (Ce$_2$(C$_2$O$_4$)$_3$). Similarly, zirconium oxide can be produced using laser pyrolysis. Suitable zirconium precursors for aerosol delivery include, for example, zirconyl chloride (ZrOCl$_2$) and zirconyl nitrate (ZrO(NO$_3$)$_2$).

The production of ternary nanoparticles of aluminum silicate and aluminum titanate can be performed by laser pyrolysis following procedures similar to the production of silver vanadium oxide nanoparticles described in copending and commonly assigned U.S. patent application Ser. No. 09/311,506, now U.S. Pat. No. 6,394,494 to Reitz et al., entitled "Metal Vanadium Oxide Particles," incorporated herein by reference. Suitable precursors for the production of aluminum silicate include, for vapor delivery, a mixture of aluminum chloride (AlCl$_3$) and silicon tetrachloride (SiCl$_4$) and, for aerosol delivery, a mixture of tetra(-butoxy) silane and aluminum isapropoxide (Al(OCH(CH$_3$)$_2$)$_3$). Similarly, suitable precursors for the production of aluminum titanate include, for aerosol delivery, a mixture of aluminum nitrate (Al(NO$_3$)$_3$) and titanium dioxide (TiO$_2$) powder dissolved in sulfic acid or a mixture of aluminum isopropoxide and titanium isopropoxide (Ti(OCH(CH$_3$)$_2$)$_4$).

Particle Dispersions

To form the composites, generally the inorganic particles are dispersed in a liquid and combined with polymer/monomers constituents and the linker. The formation of the particle dispersion generally is a distinct step of the process. Preferably, a collection of nanoparticles is, well dispersed for uniform introduction into a polymer composite. A liquid phase particle dispersion can provide a source of small secondary particles that can be used in the formation of desirable composite structures.

Desirable qualities of a liquid dispersion of inorganic particles generally depend on the concentration of particles, the composition of the dispersion and the formation of the dispersion. Specifically, the degree of dispersion intrinsically depends on the interparticle interactions, the interactions of the particles with the liquid and the surface chemistry of the particles. Both entropic and energetic consideration may be involved. The degree of dispersion and stability of the dispersion can be significant features for the production of uniform composites without large effects from significantly agglomerated particles.

Generally, the liquid dispersions refer to dispersions having particle concentrations of no more than about 80 weight percent. For the formation of a particle dispersion, the particular particle concentration depends on the selected application. At concentrations greater than about 50 weight percent, different factors can be significant with respect to the formation and characterization of the resulting viscous blend relative to parameters that characterize the more dilute particle dispersions. The concentration of particles affects the viscosity and can effect the efficacy of the dispersion process. In particular, high particle concentrations can increase the viscosity and make it more difficult to disperse the particles to achieve small secondary particle sizes, although the application of shear can assist with particle dispersion.

The composition of the dispersion depends on the composition of the dispersant and the nanoparticles. Suitable dispersants include, for example, water, organic solvents, such as alcohols and hydrocarbons, and combinations thereof. The selection of preferred solvents generally depends on the properties of the nanoparticles. Thus, the dispersant and the nanoparticles should be selected to be compatible for the formation of well dispersed particles. For example, gamma alumina particles generally are dispersed well at acidic pH values of about 3–4, silica particles generally are dispersed well at basic pH values from 9–11, and titanium oxide particles generally disperse well at a pH near 7, although the preferred pH depends on the crystal structure and the surface structure. Generally, nanoparticles with little surface charge can be dispersed preferentially in less polar solvents. Thus, hydrophobic particles can be dispersed in nonaqueous solvents or aqueous solutions with less polar cosolvents, and hydrophilic particles can be dispersed in aqueous solvent.

Since many polymers are soluble in organic solvents, many embodiments involve the formation of non-aqueous dispersions. In organic solvents, the dispersion properties have been found to depend on the solvent dielectric constant. For $TiO_2$, good dispersions are formed with intermediate values of solvent dielectric constants/polarity. This is described further in the examples below.

In addition, water based dispersions can include additional compositions, such as surfactants, buffers and salts. For particular particles, the properties of the dispersion can be adjusted by varying the pH and/or the ionic strength. Ionic strength can be varied by addition of inert salts, such as sodium chloride, potassium chloride or the like. The presence of the linker can effect the properties and stability of the dispersion. For $TiO_2$, this is described in the examples below.

The pH generally effects the surface charge of the dispersed particles. The minimum surface charge is obtained at pH value of the isoelectric point. A decrease in surface charge can result in further agglomeration. Thus, it may be useful to select the pH to yield a desired amount of surface charge based on subsequent processing steps. However, the pH of the solution can affect binding with the linker.

The liquid may apply physical/chemical forces in the form of solvation-type interactions to the particles that may assist in the dispersion of the particles. Solvation-type interactions can be energetic and/or entropic in nature. Additional compositions, such as surfactants, can be added to the liquid to assist with the dispersion for the particles. Suitable surfactants include, for example, octoxynol (sold as Triton® X);, nonxynol (sold as Doxfax® 9N and Triton® N), and dodecyltrimethyl ammonium bromide (C12 TAB, $CH_3(CH_2)_{11}N(CH_3)_3Br$).

The qualities of the dispersion generally depend on the process for the formation of the dispersion. In dispersions, besides chemical/physical forces applied by the dispersant and other compounds in the dispersion, mechanical forces can be used to separate the primary particles, which are held together by van der Waals forces and other short range electromagnetic forces between adjacent particles. In particular, the intensity and duration of mechanical forces applied to the dispersion significantly influences the properties of the dispersion. Mechanical forces can be applied to the powders prior to dispersion in a solvent. Alternatively, mechanical forces, such as. shear stress, can be applied as mixing, agitation, jet stream collision and/or sonication following the combination of a powder or powders and a liquid or liquids.

The secondary particle size refers to the size of the resulting particle agglomerates following dispersion of the powders in the liquid. Smaller secondary particles sizes are obtained if there is more disruption of the agglomerating forces between the primary particles. Secondary particles sizes equal to the primary particle sizes can be accomplished with at least some nanoparticles if the interparticle forces can be sufficiently disrupted. The use of surfactants and high shear stress can assist with obtaining smaller secondary particle sizes.

Secondary particles sizes within a liquid dispersion can be measured by established approaches, such as dynamic light scattering. Suitable particle size analyzers include, for example, a Microtrac UPA instrument from Honeywell based on dynamic light scattering and ZetaSizer Series of instruments from, Malvern based on Photon Correlation Spectroscopy. The principles of dynamic light scattering for particle size measurements in liquids are well established.

The presence of small secondary particle sizes can result in significant advantages in the application of the dispersions for the formation of composites with uniform properties. For example, smaller secondary particle sizes, and generally small primary particle sizes, may assist with the formation of smoother and/or smaller and more uniform structures using the composites. In the formation of coatings, thinner and smoother coatings can be formed with composites formed with inorganic particle dispersions having smaller secondary particles. In preferred embodiments, the average secondary particle diameter is less than about 1000 nm, preferably less than about 500 nm, more preferably from about 2 nm to about 300 nm, even more preferably from about 2 nm to about 200 nm and even more preferably from about 2 nm to about 100 nm. The primary particle size, of course, is the lower limit of the secondary particle size for a particular collection of particles, so that the average secondary particle size preferably is approximately the average primary particle size. For some particle dispersions, the secondary particle size can be approximately the primary particle size indicating that the particles are well dispersed.

Once the dispersion is formed, the dispersion may eventually separate such that the particles collect on the bottom of the container without continued mechanical stirring or agitation. Stable dispersions have particles that do not separate out of the dispersion. Different dispersions have different degrees of stability. The stability of a dispersion depends on the properties of the particles, the other compositions in the dispersion, the processing used to form the dispersion and the presence of stabilizing agents. Suitable stabilizing agents include, for example, surfactants. Preferably, dispersions are reasonably stable, such that the dispersions can be used without significant separation during the subsequent processing steps forming the composites, although suitable processing to form the composite can be used to ensure constant mixing or the like to prevent separation of the particle dispersion.

Formation of Composites

The linker compound and the polymer/monomer components can be added to the liquid with the particle dispersion simultaneously or sequentially. The order of combining the various constituents can be selected to achieve the desired results. The conditions within the liquid preferably are suitable for the bond formation with the linker and possibly other bond formation involving the polymer/monomer constituents. Once the composite is formed, the liquid can be removed or solidified to leave behind a structure formed from the composite.

The polymer/monomer composition can be formed into a solution/dispersion prior to addition to the inorganic particle dispersion, or the polymer/monomer can be added as a solid to the particle dispersion. In preferred embodiments, the polymer/monomer compositions are soluble in the liquid used to form the particle dispersion. If the polymer/monomer is not soluble/dispersible in the particle dispersion, either the polymer/monomer solution or the particle dispersion is slowly added to the other while mixing to effect the reaction. Whether or not the polymer/monomer is first solubilized separate from the inorganic particle dispersion may depend on the kinetics of the polymer/monomer solubilization and on the desired concentrations of the various solutions/dispersions. Similarly, bonding kinetics can influence the order and details of the mixing procedures.

The linkers generally can be added to the particle dispersion, to a polymer/monomer solution or to a mixture of the inorganic particles and the polymer/monomer. For self-polymerizing linkers, it is preferable to add the linkers to the particle dispersion such that the linkers more likely bond to the particle surface rather than self-condensing. For example, alkoxysilanes hydrolize to a form that self-polymerizes. The order and amount of adding the linker may influence the details of the resulting composite structure. In particular, the linker preferably is well dispersed when reacted with the inorganic particles such that more uniform bonding to the inorganic particles results.

In some embodiments, the reaction conditions and/or the presence of a catalyst or the like is needed to initiate the reaction of the linker with the inorganic particle and/or the polymer/monomer. In these embodiments, the components can be mixed prior to the adjustment of the reaction conditions of the addition of a catalyst. Thus, a well mixed solution/dispersion can be formed prior to the adjustment of the reaction conditions or addition of the catalyst to form a more uniform composite.

Processing and Self-Assembly

Following formation of the polymer/inorganic particle composite, the composite can be subjected to further processing. Herein for convenience, the composite refers to the bonded inorganic particle-linker-polymer/monomer structure whether in solution, a dispersion, a coating or a solid form. For example, the properties of the solution/dispersion, such as concentration and solvent composition, containing the composite can be modified to facilitate the further processing, for storage of the composite and/or for convenience. In preferred embodiments, the composites subsequently are incorporated into particular structures or devices to take advantage of the properties of the composite, as described further below. To facilitate formation into localized devices, the polymer can be selected for self-organization properties that assist the self-assembly of the, composite into a localized structure. Self-assembled structures can be formed from self-assembly with particles segregated to one or another phase of the polymer within the composite, in which different polymer phases are identifiable due to self-organization.

The solution/dispersion in which the composite is formed can be used directly in further processing. Alternatively, the composite can be removed from the liquid or placed in a different liquid. The liquid of the solution/dispersion can be changed by dilution, i.e., the addition of a different liquid to solution/dispersion, by dialysis to replace the liquid if the composite has sufficient molecular weight to be retained by dialysis tubing, or by removing the liquid and solubilizing/dispersing the composite with the replacement liquid. Dialysis tubing with various pore sizes are commercially available. To substitute liquids, a liquid mixture can be formed, and subsequently the original liquid is removed by evaporation, which can be particularly effective if the liquids form an azeotrope. The polymer/inorganic composite can be removed from a liquid by evaporating the liquid, by separating a dispersion of the complex by filtration or centrifugation, or by changing the properties, such as pH, liquid composition or ionic strength, of the solution/dispersion to induce the settling of the complex from the liquid.

Generally, the composite can be processed using standard polymer processing techniques, including heat processing and solvent processing approaches. For example, the polymer/inorganic particle composite can be formed into structures by compression molding, injection molding, extrusion and calendering. In other words, the composites can be formed into free structures, such as sheets. Similarly, the composites can be formed into fibers or a layer on a fiber using techniques, such as extrusion or drawing a softened form of the composite. Solutions/dispersions can be formed into films/coatings by spin casting and similar methods. Coatings can be formed with various parameters including, for examples, thin coatings with thicknesses less than about 1 micron.

In some embodiments, the composite is formed into localized structures by self-assembly. The composition and/or structure of the composite can be selected to encourage self-organization of the composite itself. For example, block copolymers can be used such that the different blocks of the polymer segregate, which is a standard property of many block copolymers. Suitable block copolymers include, for example, polystyrene-block-poly(methyl methacrylate), polystyrene-block-polyacrylamide, polysiloxane-block-polyacrylate and mixtures thereof. These block copolymers can be modified to include appropriate functional groups to bond with the linkers. For example, polyacrylates can be hydrolyzed or partly hydrolyzed to form carboxylic acid groups, or acrylic acid moieties can be substituted for all or part of the acrylated during polymer formation if the acid groups do not interfere with the polymerization. Alternatively, the ester groups in the acrylates can be substituted with ester bonds to diols or amide bonds with diamines such that one of the functional groups remains for bonding with a linker. Block copolymers with other numbers of blocks and other types of polymer compositions can be used.

The inorganic particles can be associated with only one of the polymer compositions within the block such that the inorganic particles are segregated together with that polymer composition within the segregation block copolymer. For example, an AB di-block copolymer can include inorganic particles only within block A. Segregation of the inorganic particles can have functional advantages with respect to taking advantage of the properties of the inorganic particles. Similarly, tethered inorganic particles may separate relative to the polymer by analogy to different blocks of a block copolymer if the inorganic particles and the corresponding polymers have different salvation properties. In addition, the nanoparticles themselves can segregate relative to the polymer to form a self-organized structure.

Other ordered copolymers include, for example, graft copolymers, comb copolymers, star-block copolymers, dendrimers, mixtures thereof and the like. Ordered copolymers of all types can be considered a polymer blend in which the polymer constituents are chemically bonded to each other. Physical polymer blends may also be used and may also exhibit self-organization, as described in the examples below. Polymer blends involve mixtures of chemically distinct polymers. The inorganic particles may bond to only a subset of the polymer species, as described above for block copolymers. Physical polymer blends can exhibit self-organization similar to block copolymers. The presence of the inorganic particles can sufficiently modify the properties of the composite that the interaction of the polymer with inorganic particles interacts physically with the other polymer species differently than the native polymer alone.

Regardless of the self-organization mechanism, some self-organized composites involve nanoparticles aligned with periodicity in a superstructure or super crystal structure. The particles may or may not be crystalline themselves yet they will exhibit properties due to the ordered structure of the particles. Photonic crystals make use of these crystal superstructures, as described further below.

The self-organization capabilities of the composites can be used advantageously in the formation of self-assembled structures on a substrate surface. To bind the composite to the surface, the polymer can be simply coated onto the surface or the composite can form chemical bonds with the surface. For example, the polymer can include additional functional groups that bond to one or more structures and/or one or more materials on the surface. These additional functional groups can be functional side groups selected to assist with the self-assembly process.

Alternatively, the substrate surface can have compositions, a surface linker, that bond to the polymer and/or to the inorganic particles such that a composite is bonded to the surface through the polymer or the inorganic particles. For example, the substrate can include organic compositions with one or more functional groups such as halogens, such as Br, CN, SCOCH$_3$, SCN, COOMe, OH, COOH, SO$_3$, COOCF$_3$, olefinic sites, such as vinyl, amines, thiol, phosphonates and combinations thereof. Alternatively, the surface linker has functional groups that react with unreacted functional groups in the polymer. Appropriate functional groups in the surface linker to bond with the polymer are equivalent to the functional groups in the composite linker to bond with the polymer.

In some embodiments involving self-assembly with nanoparticles, a portion of the substrate surface is provided with pores, which can be holes, depressions, cavities or the like. The pores can be in an ordered array or a random arrangement. The size of the pores should be larger than the size of the nanoparticles. Generally, the pores have a diameter less than a micron, although the preferred size of the pores and density of the pores may depend on the particular desired properties of the resulting device.

To deposit the composites within the pores, the surface is contacted with a dispersion of the composites. Then, for example, the dispersion is destabilized with respect to the composites, such that the composites tend to settle onto the surface and into the pores. The dispersion can be destabilized by altering the pH, such as adjusting the pH toward the isoelectric point, by diluting surfactants or by adding a cosolvent that results in a less stabile dispersion. The dispersion is removed after the deposition of a desirable amount of composites. Then, composite on the surface not in the pores can be removed. For example, the surface can be rinsed gently with a dispersant to remove composite on the surface. Alternatively, the surface can be planarized by polishing, such as mechanical polishing or chemical-mechanical polishing. If the dispersant is properly selected to be not be too effective at dispersing the composite and if the rinsing is not done too extensively, the composite along the surface can be preferentially removed while leaving the composite within the pores behind.

A porous structure can be formed using anodized aluminum oxide or other metal oxides. Anodized aluminum oxide forms highly oriented and very uniform pores. Pores are formed in anodic aluminum oxide by place an aluminum anode in a solution of dilute acid, such as sulfuric acid, phosphoric acid, or oxalic acid. As the aluminum is oxidized, aluminum oxide with pores is formed. Pore diameters at least can be varied between 4 nm and 200 nm. The pores have a depth on a micron scale. The formation of porous anodized aluminum oxide is described, for example, in D. Al-Mawlawi et al., "Nano-wires formed in anodic oxide nanotemplates," J. Materials Research, 9:1014–1018 (1994) and D. Al-Mawlawi et al., "Electrochemical fabrication of metal and semiconductor nano-wire arrays," in Proc. Symp. Nanostructured Mater. Electrochem., 187th Meeting Electrochem. Soc., Reno, NV, May 21–26, 1995, Electrochem. Soc. 95(8):262–273 (1995). The use of block co-polymers to form ordered array of pores from silica and filling the pores to form a photonic crystal is described in U.S. Pat. No. 6,139,626 to Norris et al., entitled "Three-Dimensionally Patterned Materials and Methods For Manufacturing, Same Using Nanocrystals," incorporated herein by reference.

The formation of a plurality of devices on a surface requires the localization of compositions active in the devices within prescribed boundaries associated with the particular device. To localize a structure within prescribed boundaries by self-assembly, the overall procedure generally requires both a process defining the boundaries of the structure and a separate self-assembly process using a chemical affinity to associate the compositions of the device within the boundaries. The boundary defining process generally utilizes external forces to define the extent of the structures. The self-assembly process itself generally does not define the boundaries of the structure. Self-assembly is based on a natural sensing function of the compositions/ materials that results in a natural ordering within the resulting structure as the compositions/materials associate. In general, the localization step can be performed before or after the self-assembly process, although the nature of the processing steps may dictate a particular order. The net effect results in a self-assembled structure with a corresponding coverage of polymer/inorganic particle composite within the boundary and an area outside of the boundary lacking this coverage.

The separate boundary defining process is coupled to the self-assembly process by activating the self-assembly process within the boundaries or by deactivating the area outside of the boundaries. Generally, an outside force is applied to perform the activation or deactivation process. The localization can be performed, for example, using a mask or the like, or using maskless lithography with focused radiation, such as an electron beam, an ion beam or a light beam.

The identification of a suitable activation or deactivation technique may depend on the particular self-assembly approach used. The localization approaches generally involve either activation of the area for the placement of the self-assembled structure or by deactivating locations separate from the selected locations. In particular, the localization approach isolates the region for the formation of the self-assembled structure. Suitable physical forces or chemical materials are applied to perform the activation/ deactivation.

Various approaches can be adapted for these purposes, including, for example, conventional integrated electronic circuit processing approaches. Specifically, mask techniques can be used to isolate the boundaries of the activation/ deactivation process. Radiation or chemical application can be performed in regions defined by the mask. Similarly, focused beams can be used to perform the localization. Suitable focused beams to achieve surface modification include, for example, light beams, such as ultraviolet light or x-ray, laser beams, electron beams or ion beams, which can be focused to impinge on the selected region to perform activation or deactivation. Suitable focusing approaches are known in the art.

An activation process can involve the formation of a specific material at the desired location or the removal of a material or composition that is inhibiting self-assembly at the desired location. Specifically, a particular material can be formed within the boundaries that allows for the self-assembly process to occur within the boundaries, while the surface material outside of the boundaries does not allow for the self-assembly process. For example, a chemically reactive layer can be formed within the boundaries that binds to a polymer, while the substrate surface outside the boundary has a different chemical functionality that does not bind to the polymer. Similarly, a layer of an inhibiting compound can be removed from the area within the boundaries to expose a surface material that binds to a compound required in the self-assembly process, such as a surface linker. The inhibiting compound can be a photoresist compound in some instances that physically blocks the surface and is selectively removable before or after the self-assembly process. The composition of the photoresist or other inhibition compound is selected to inhibit the self-assembly process such that the regions covered by the inhibitory compound surrounding the boundary region subsequently do not become involved in the self-assembly process.

Similarly, the regions outside of the boundary region can be deactivated. For example, a composition that binds a compound involved in the self-assembly process can be applied over an entire surface. Then, the composition can be removed from outside of the bounded region selected for the self-assembly process. Then, the self-assembly process only takes place within the bounded region. In addition, an inhibitor material can be specifically deposited outside of the boundary region so that the self-assembly process only takes place within the bounded region where the inhibitory material has been removed. Similarly, radiation can be used to inactivate or dissociate compounds outside of the bounded region. The mask and/or focused beam approaches described above can be used to perform the deactivation processes. As noted above, strata or layers can be processed to produce a three dimensional integrated structure.

A localization process used along with self-assembly is described further in copending and commonly assigned U.S. patent application Ser. No. 09/558,266 to Kambe et al., entitled "Self Assembled Structures," incorporated herein by reference.

Uses of Composites

The polymer/inorganic particle composite materials are suitable for the efficient formation of devices incorporating a very wide range of materials. The composites can incorporate preferably one or more of the various very uniform nanoparticles that have been described above. Selective incorporation of particular composites into a particular device can establish desired function for a device due to the choice of composite.

In preferred embodiments, the structures form a microscopic configuration with two dimensional or three dimensional features that are integrated to form a complete integrated article. The term "nanoscopic" is used to refer to structure within an individual self-assembled device. The resulting three dimensional structure forms a superlattice or superstructure. Also, fibers formed using the composites can be used, for example, as optical fibers or as electrical or opto-electronic devices.

Figure 10:
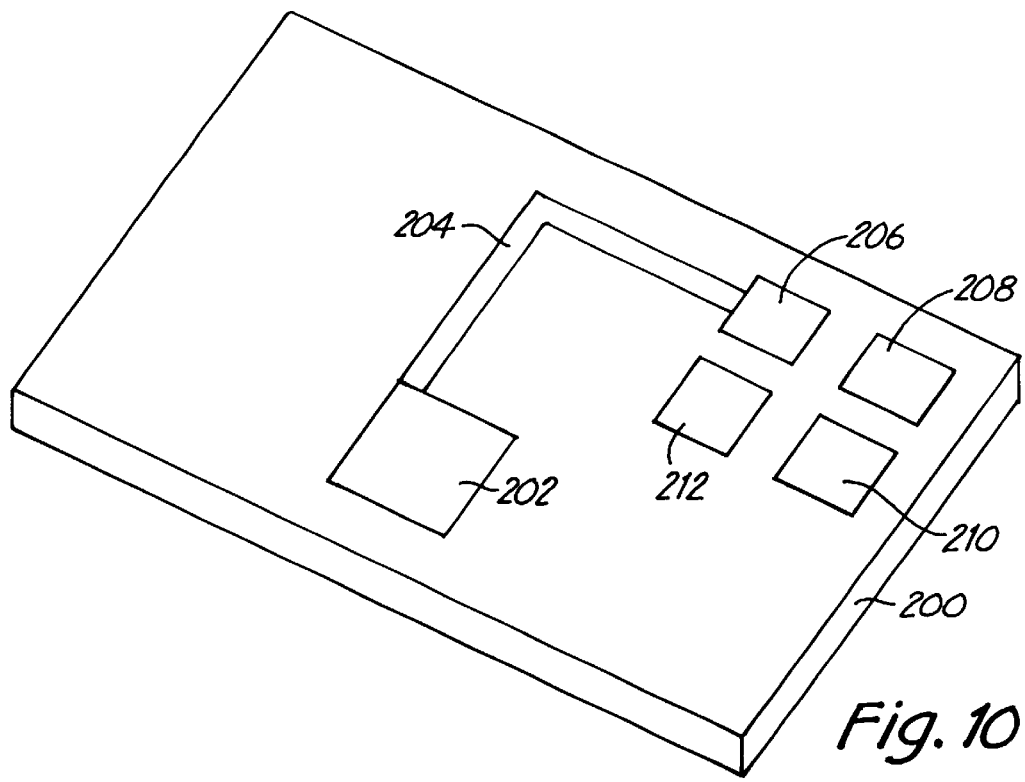
FIG. 10 is a schematic diagram of integrated devices, at least a portion of which include polymer/inorganic particle composites.

Examples of structures placed along a substrate incorporating polymer/inorganic particle composites are shown in FIG. 10. Referring to FIG. 10, a substrate 200 includes structures or islands 202, 204, 206, 208, 210, 212 with composite material. Integrated self assembled structures are described further in copending and commonly assigned U.S. patent application Ser. No. 09/558,266 to Kambe et al., entitled "Self Assembled Structures, " incorporated herein by reference. Each of the composites in structures 202, 204, 206, 208, 210, 212 can include the same composition or a different polymer composition and/or inorganic particles as the other structures. Preferred nanoscale particles have a narrow particle size distribution of primary particles, such as the nanoparticles described above formed by laser pyrolysis. Similarly, preferred nanoscale particles have a small average secondary particle size, generally resulting from the use of a preferred particle dispersion.

Suitable devices incorporating nanoparticles or other self-assembled compositions include, for example, energy sources, such as batteries; photonic crystals; active electrical or electro-optical elements, such as field emission devices; and passive elements, such as electrical interconnects, barrier layers and insulating layers. Electrodes can be formed with self-assembled electroactive particles along with electrically conductive particles. Similarly, the electrodes can be formed with electrically conducting polymers and suitable inorganic particles to form the composite.

Photonic crystals are ordered arrays of composite composition having a unit cell size of the photonic crystal ranging from about one quarter to about one optical wavelength. The index-of-refraction of the material depends on the wavelength of light. For example, visible light in air has a wavelength of about 380 nm to about 780 nm. Generally, photonic crystals of interest have size from about 100 nm to about 1000 nm. The particles form a crystal superstructure with alternating regions of index-of-refraction. The photonic crystals can be formed from an ordered array of nanoparticles of, for example, metals, silica, silicon nitride, silicon oxynitride, titania or zinc oxide. Due to the size of the ordered arrays, the photonic crystals can have a photonic band gap that prevents propagation of light in any direction. Thus, photonic crystals can be used for control of spontaneous emission and for very sharp bending of light. Self-assembly, as described above, can be used to form the ordered arrays.

Electrical interconnects can be constructed from electrically conductive particles, for example, metal nanoparticles, such as silver and gold nanoparticles. Similarly, optical interconnects provide for transmission of light between devices. Integrated optical interconnects can be formed from materials with suitable indices of refraction. For transmitting visible light, silica, alumina and zinc oxide, for example, can be used. Barrier layers can be formed, for example, from silicon oxide particles under higher index-of-refraction materials. Insulating layers can be formed, for example, from silicon dioxide nanoparticles. Field emission devices for displays can incorporate phosphor particles, such as zinc oxide or doped zinc oxide.

Figure 11:
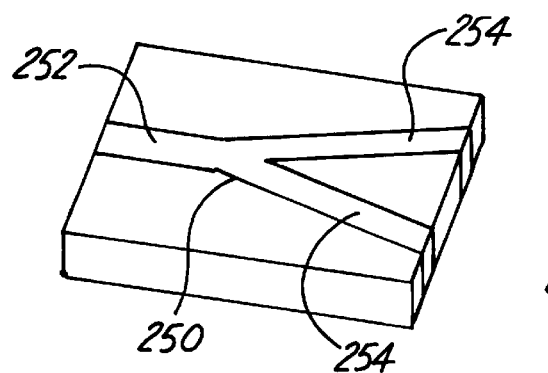
FIG. 11 is a schematic diagram of a coupler including a polymer/inorganic particle composite.

Referring to FIG. 11, a coupler/divider is shown. Coupler/divider 250 includes a coupled arm 252 and two branches 254. Coupler/divider 250 can be used to connect a plurality of devices by electrical transmission or for optical transmission. Suitable materials for electrical and optical transmission are described above.

Figure 12:
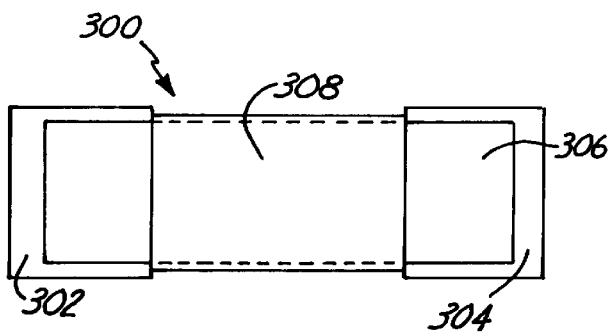
FIG. 12 is a top plan view of a field effect transistor.
Figure 13:
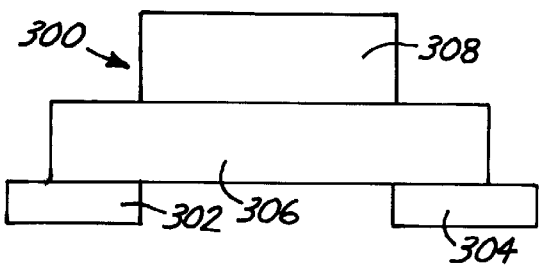
FIG. 13 is a side plan view of the field effect transistor of FIG. 9.

Referring to FIGS. 12 and 13, a field effect transistor (FET) is shown. FET 300 includes a source electrode 302, a drain electrode 304, a channel 306 and a gate electrode 308. One or more of the elements can be constructed using self-assembled materials using the approaches described herein. In particular, electrodes 302, 304, 308 can be formed using electrically conductive metals, as described above. Channel 306 can be formed from an electrically insulating material.

In particular, the use of polymer/inorganic particle composites is particularly useful for the formation of devices with a selected dielectric constant/index-of-refraction. Through index-of-refraction engineering, the materials can be designed specifically for a particular application. Appropriate selection of index-of-refraction can be important for the preparation of either electrical or optical materials. The index-of-refraction is approximately the square root of the dielectric constant when there is no optical loss, so that the engineering of the index-of-refraction corresponds to the engineering of the dielectric- constant. Thus, the index-of-refraction/dielectric constant is related to both the optical and electrical response of a particular material. Index-of-refraction engineering can be especially advantageous in the design of optical or electrical interconnects.

For optical materials, the transmission of light and optical properties at interfaces depend directly on the selection of an appropriate index-of-refraction. In particular, the refractive and reflective optical properties of a material are directly related to the index-of-refraction. For example, high index-of-refraction materials can be used to form microlenses that focus light due to bending of light at interfaces with lower index materials. These lenses can be called graded index lenses. The angle of the bending of light can be expressed according to Snell's law, $n_1 \sin\theta_1 = n_2 \sin\theta_2$, where $n_1$ and $n_2$ are the indices of refraction in the respective materials 1 and 2 and $\theta_1$ and $\theta_2$ are the respective, angles. The imaginary portion of the complex index-of-refraction is related to the absorption of light.

In addition, the electrical properties of a material can also depend on the dielectric constant. For example, the capacitance of a material is directly proportional to the dielectric constant of the material. To reduce the capacitance of an electrical interconnect within an integrated circuit, it is desirable to have a low dielectric constant, preferably less than 2. Thus, low K materials are desired for fabrication into integrated circuits.

In addition, the time constant for electrical response of a material is related to the dielectric constant. In response to an electric field, a conducting medium generally approaches electrostatic equilibrium with a rate proportional to $e^{-gt/K}$, where t is time, g is a constant and K is the dielectric constant. Thus, if K is larger, the conductor approaches equilibrium more slowly. In a field effect transistor, it is desirable to have a high K material adjacent the channel. In the embodiment shown in FIGS. 12 and 13, the channel 306 connects source electrode 302 and drain electrode 308. The use of high K material adjacent the channel reduces current leakage.

Since laser pyrolysis is a flexible method for the synthesis of a wide range of inorganic particles/powders, these particles can be selected to have a desired dielectric constant. Specifically, $TiO_2$ generally has a high index-of-refraction with values ranging from about 2.5. to about 2.9. $SiO_2$ generally has a relatively low index-of-refraction from about 1.45 to about 1.5. Polymers generally have a low index of refraction from about 1.3 to about 1.6. The high index-of-refraction composites preferably have an index-of-refraction of at least about 1.8. The low index-of-refraction composites preferably have an index-of-refraction of no more than about 1.5.

EXAMPLES

Example 1

Formation of Titanium Oxide Particles

Rutile $TiO_2$, anatase $TiO_2$, and oxygen deficient blue $TiO_2$ particles were produced by laser pyrolysis. The reaction was carried out in a chamber comparable to the chamber shown in FIGS. 14–16.

Figure 14:
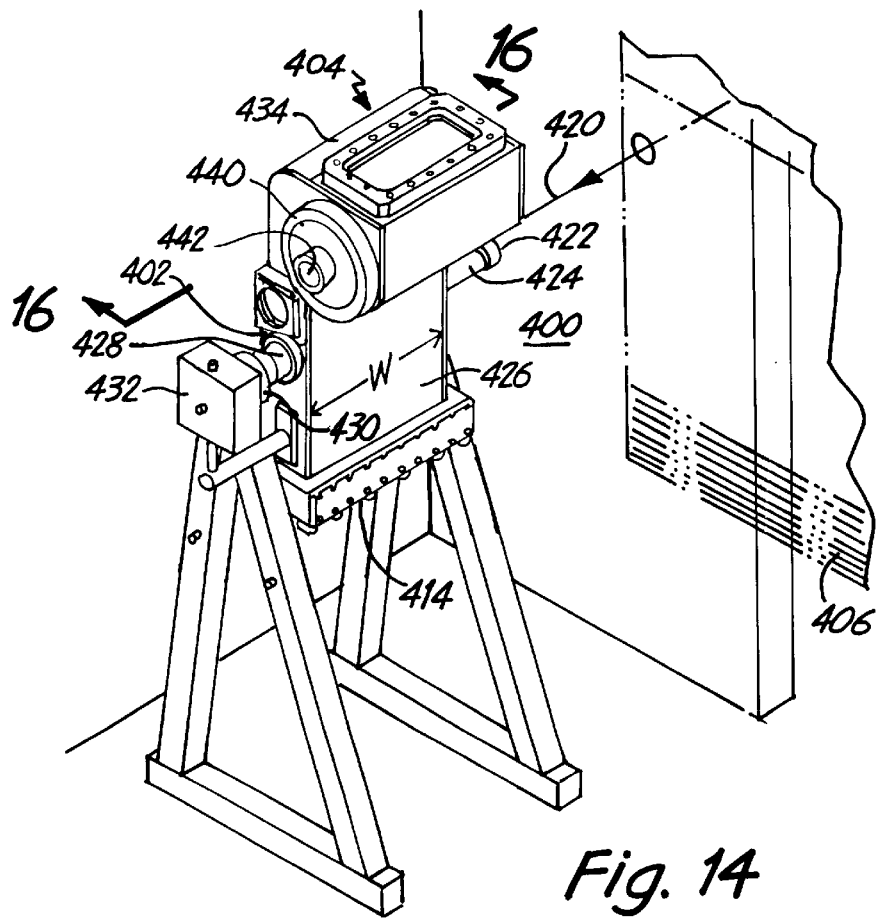
FIG. 14 is a perspective view of a laser pyrolysis apparatus used in the production of titanium oxide.
Figure 15:
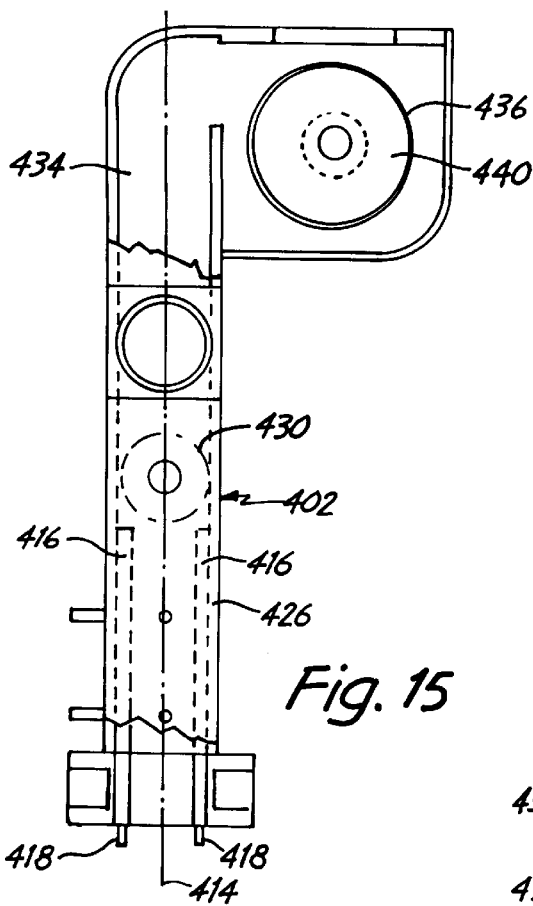
FIG. 15 is a cut away side view of the laser pyrolysis apparatus of FIG. 14.
Figure 16:
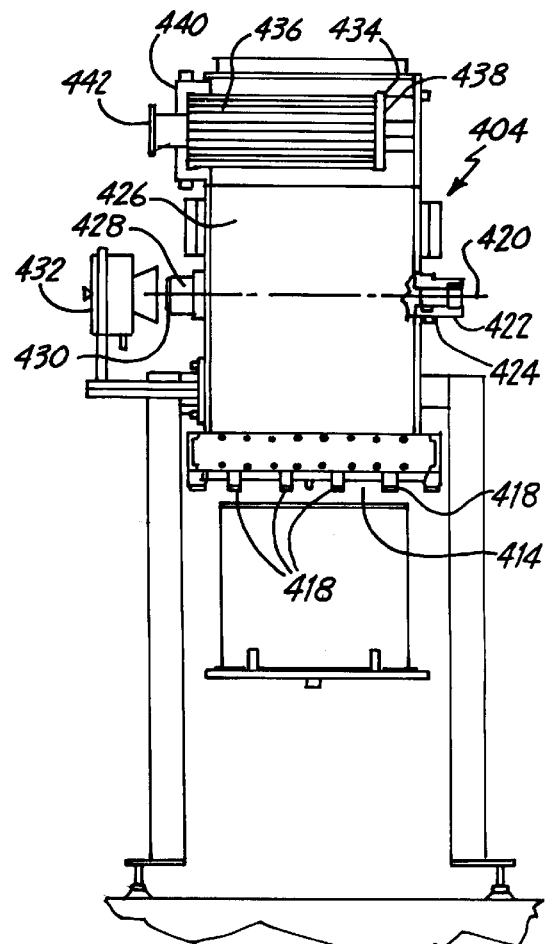
FIG. 16 is a sectional view of the laser pyrolysis apparatus of FIG. 14 taken along line 16—16 of FIG. 14.

Referring to FIGS. 14–16, a pyrolysis reaction system 400 includes reaction chamber 402, a particle collection system 404 and laser 406. Reaction chamber 402 includes reactant inlet 414 at the bottom of reaction chamber 402 where reactant delivery system 408 connects with reaction chamber 402. In this embodiment, the reactants are delivered from the bottom of the reaction chamber while the products are collected from the top of the reaction chamber.

Shielding gas conduits 416 are located on the front and back of reactant inlet 414. Inert gas is delivered to shielding gas conduits 416 through ports 418. The shielding gas conduits direct shielding gas along the walls of reaction chamber 402 to inhibit association of reactant gases or products with the walls.

Reaction chamber 402 is elongated along one dimension denoted in FIG. 14 by "w". A laser beam path 420 enters the reaction chamber through a window 422 displaced along a tube 424 from the main chamber 426 and traverses the elongated direction of reaction chamber 402. The laser beam passes through tube 428 and exits window 430. In one preferred embodiment, tubes 424 and 428 displace windows 422 and 430 about 11 inches from the main chamber. The laser beam terminates at beam dump 432. In operation, the laser beam intersects a reactant stream generated through reactant inlet 414.

The top of main chamber 426 opens into particle collection system 404. Particle collection system 404 includes outlet duct 434 connected to the top of main chamber 426 to receive the flow from main chamber 426. Outlet duct 434 carries the product particles out of the plane of the reactant stream to a cylindrical filter 436. Filter 436 has a cap 438 on one end. The other end of filter 436 is fastened to disc 440. Vent 442 is secured to the center of disc 440 to provide access to the center of filter 436. Vent 442 is attached by way of ducts to a pump. Thus, product particles are trapped on filter 436 by the flow from the reaction chamber 402 to the pump.

Titanium tetrachloride (Strem Chemical, Inc., Newburyport, Mass.) precursor vapor was carried into the reaction chamber by bubbling Ar gas through $TiCl_4$ liquid in a container at room temperature. $C_2H_4$ gas was used as a laser absorbing gas, and argon was used as an inert gas. $O_2$ was used as the oxygen source. Additional argon was added as an inert diluent gas. The reactant gas mixture containing $TiCl_4$, Ar, $O_2$ and $C_2H_4$ was introduced into the reactant gas nozzle for injection into the reactant chamber.

Representative reaction conditions for the production of rutile $TiO_2$ particles and anatase $TiO_2$ particles are described in Table 1. The blue-oxygen deficient rutile $TiO_2$ ($TiO_2$-2) was obtained from the same conditions as the rutile $TiO_2$ particles ($TiO_2$-1) in Table 1, except that they were collected closer to the reaction zone by positioning the particle collector accordingly. Low chamber pressure and low partial pressure of oxygen contribute to the oxygen deficiency in the resulting $TiO_2$. Heating of the particles slightly in air results in the loss of blue color and the formation of a rutile structure.

TABLE 1

| Phase | $TiO_2$-1 Rutile $TiO_2$ | $TiO_2$-3 Anatase $TiO_2$ |
| --- | --- | --- |
| BET Surface Area ($m^2/g$) | 64 | 57 |
| Pressure (Torr) | 110 | 150 |
| Ar-Dilution Gas (slm) | 4.2 | 8.4 |
| Ar-Win (slm) | 10.0 | 10.0 |
| Ar-Sld. (slm) | 2.8 | 2.8 |
| Ethylene (slm) | 1.62 | 1.25 |
| Carrier Gas-Ar (slm) | 0.72 | 0.72 |
| Oxygen (slm) | 2.44 | 4.5 |
| Laser Power-Input (Watts) | 1400 | 1507 |
| Laser Power-Out (watts) | 1230 | 1350 | sccm = standard cubic centimeters per minute
slm = standard liters per minute

Argon-Win.=argon flow through inlets 490, 492
Argon-Sld.=argon flow through slots 554, 556

Figure 17:
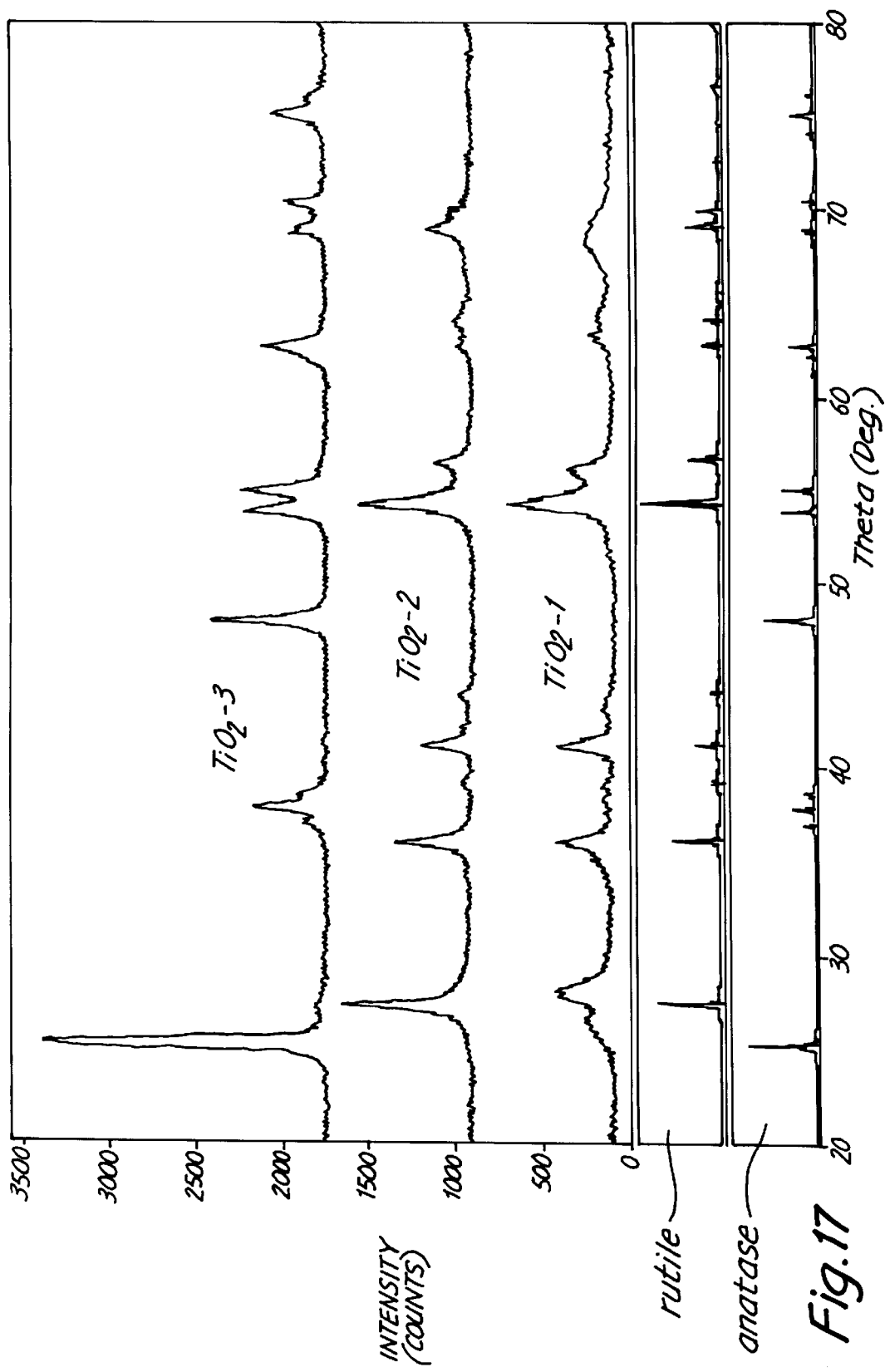
FIG. 17 is a plot of three x-ray diffractograms for each of three different $TiO_2$ powder samples.

An x-ray diffractogram of product nanoparticles produced under the conditions in Table 1 are shown in FIG. 17. Sample $TiO_2$-1 had an x-ray diffractogram corresponding to rutile $TiO_2$. Sample $TiO_2$-2 had an x-ray diffractogram similar to sample $TiO_2$-1. Sample $TiO_2$-3 had an x-ray diffractogram corresponding to anatase $TiO_2$. The broadness of the peaks in FIG. 17 indicates that sample 1 is less crystalline than the other two samples. Some peaks in the spectra of sample $TiO_2$-1 seem to originate from amorphous phases.

Example 2

Formation of Particle Suspensions

This example provides a description of the formation of well dispersed dilute solutions of titanium oxide nanoparticles produced by laser pyrolysis, as described in Example 1.

The suspensions were formed using each of the three types of $TiO_2$ particles described in Example 1. The three powders were separately suspended in water, ethanol, dimethyl sulfoxide (DMSO), cyclohexane, cyclohexanone and phentydrone (1,2,3,4-tetrahydro-9-fluorenone, THF). The suspensions were formed with 9.75 milligrams (mg) of $TiO_2$ powders in 13 grams of liquid resulting in a suspension with 0.075 wt % $TiO_2$. The samples were sonicated for 2 hours each in a sonicate bath. Then, the relative sedimentation of all the samples was visually detected in parallel for two weeks.

The results are presented in Table 2. The relative sedimentation of all the samples is marked in parentheses following observations after two weeks and then several months, with number 1 being the worst and number 7 being the best.

TABLE 2

| Solvent | $TiO_2$-1 | $TiO_2$-2 | $TiO_2$-3 |
| --- | --- | --- | --- |
| water | very poor (3) 100% settled | very poor (1) 100% settled | very poor (2) 100% settled |
| cyclohexanone | very good (4) ~90% suspended | very good (5) ~85% suspended | excellent (7) ~100% suspended |
| cyclohexane | very poor (2) 100% settled | very poor (2) 100% settled | very poor (3) 100% settled |
| ethanol | excellent (6) ~95% suspended | good (4) >75% settled | excellent (6) ~90% suspended |
| THF | excellent (5) ~95% suspended | excellent (7) >30% settled* | very poor (4) ~100% settled |
| DMSO | very good (7) ~80% suspended* | very good (6) >50% settled* | poor (5) >70% settled |
| toluene | very poor (1) 100% settled | very poor (3) 100% settled | very poor (1) 100% settled |

*The suspended particles remained suspended for months.

Figure 18:
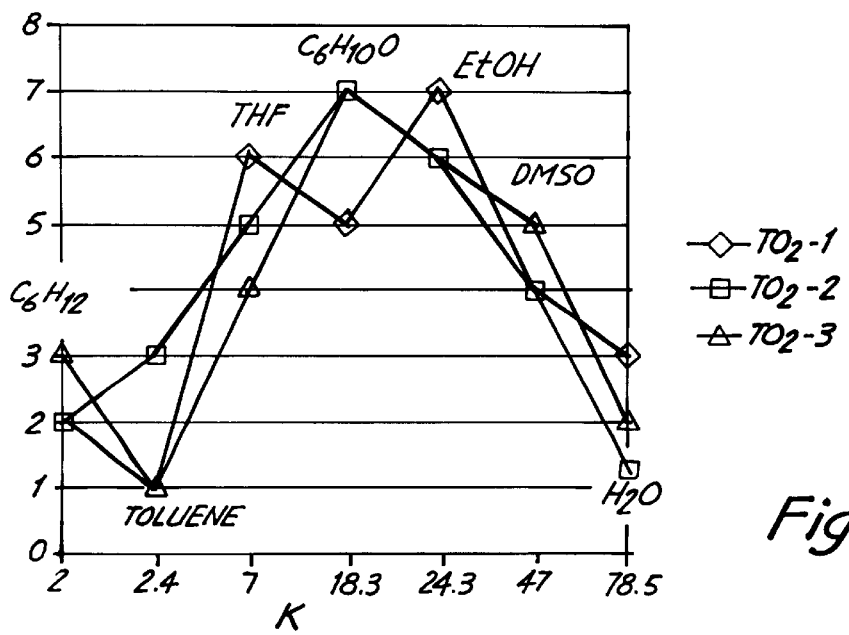
FIG. 18 is a plot of relative ranking for forming dispersions as a function of solvent dielectric constant.

The best suspensions for a short term period (i.e., minimum sedimentation is observed after two weeks) were formed with cyclohexanone and ethanol. THF also suspended one of the samples extremely well. These suspensions exhibited no or only slight deposition of particles even after two weeks. A graph of relative ranking, after observations after two weeks, as a function of dielectric constant (K) is shown in FIG. 18. This plot suggests that solvents/dispersants with medium polarity provide the best suspensions, while solvents with very low or very high dielectric constant are not as suitable.

Secondary particle size in the suspensions were evaluated with a Horiba Particle Size Analyzer (Horiba, Kyoto, Japan). Analysis with the particle size analyzer showed good dispersion/low agglomeration with all dispersants that suspended well the particles. Generally, all of the suspended particles were in the size region below 80 nm, with broader distributions with lower average particle size.

Since the particle size analyzer had a detection cut-off at 30 nm, an internal standard was used to estimate the number of particles with diameters less than 30 nm. A well characterized commercial TiO$_2$ powder (R706 average particle size 0.36 microns with a coating of Al$_2$O$_3$, DuPont, Wilmington, Del.) was mixed with the nanoparticles in a 1 to 1 by weight ratio. The resulting suspension was analyzed with the Horiba particle size analyzer. Less than about 10 percent of the nanoparticles were observed. Thus, most of the nanoparticles had a diameter less than about 30 nm and are undetected by the particle size analyzer. Nevertheless, the trends measured with the particle size analyzer were indicative of the level of agglomeration. In particular, good dispersions were formed with solvents that performed well in suspending the particles.

Figure 19:
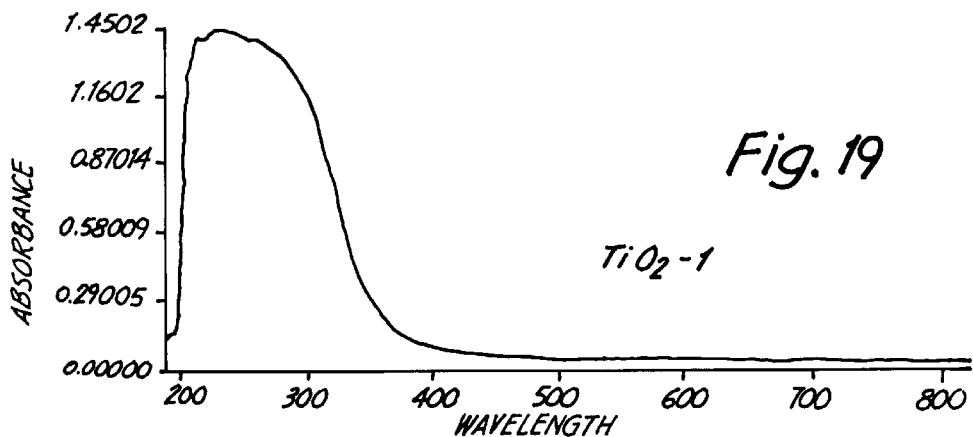
FIG. 19 is a plot of an absorption spectrum in arbitrary units as a function of wavelength for a 0.003 weight percent dispersion of $TiO_2$-1 in ethanol.
Figure 20:
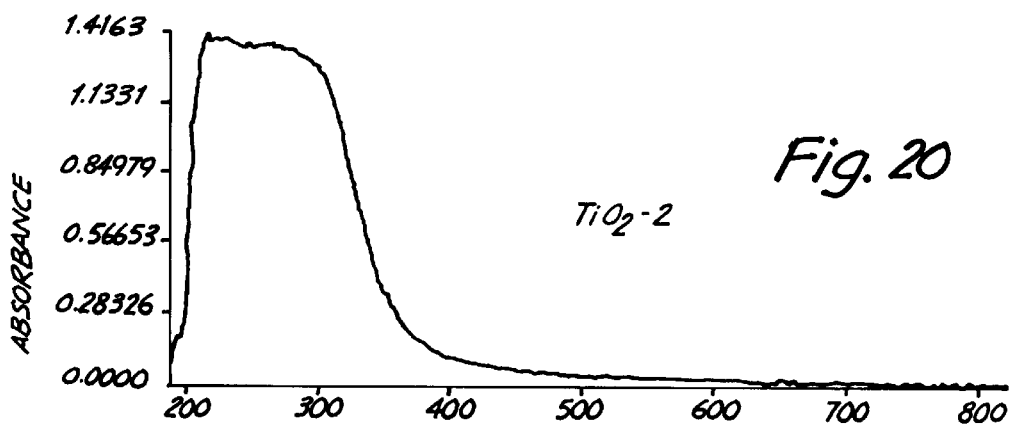
FIG. 20 is a plot of an absorption spectrum in arbitrary units as a function of wavelength for a 0.003 weight percent dispersion of $TiO_2$-2 in ethanol.
Figure 21:
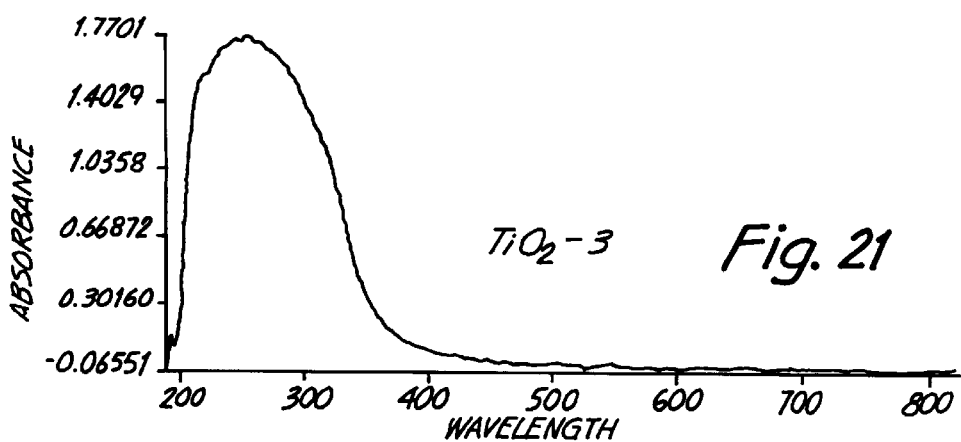
FIG. 21 is a plot of an absorption spectrum in arbitrary units as a function of wavelength for a 0.003 weight percent dispersion of $TiO_2$-3 in ethanol.
Figure 22:
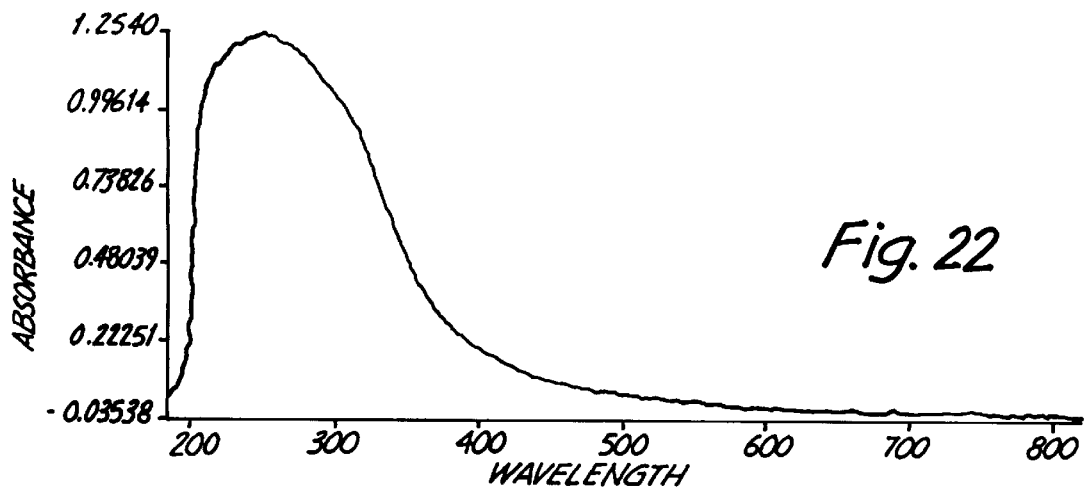
FIG. 22 is a plot of an absorption spectrum in arbitrary units as a function of wavelength for a 0.003 weight percent dispersion of one commercial brand of $TiO_2$ in ethanol.
Figure 23:
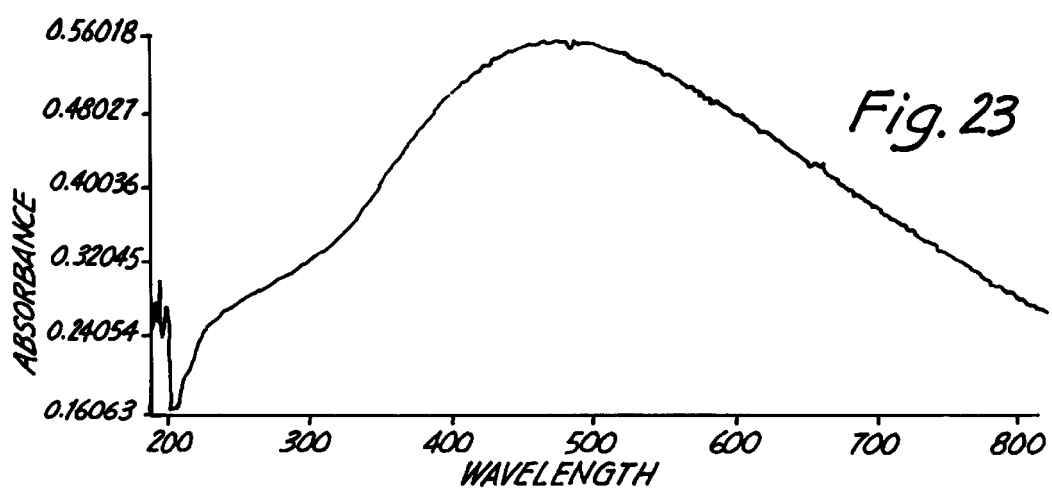
FIG. 23 is a plot of an absorption spectrum in arbitrary units as a function of wavelength for a 0.003 weight percent dispersion of a second commercial brand of $TiO_2$ in ethanol.

Absorption spectra were obtained for titanium oxide particles in ethanol at a concentration of 0.003 weight percent. The spectra for TiO$_2$-1, TiO$_2$-2 and TiO$_3$-3 samples are shown in FIGS. 19–21, respectively. For comparison, similar spectra were obtained for two commercial TiO$_2$ powders dispersed in ethanol at a concentration of 0.0003 weight percent, which are shown in FIGS. 22 and 23. The first commercial powder (FIG. 22) was obtained from Alfa Aesar, Inc., Ward Hill, Mass. and had an average particle size of 0.17 microns. The second commercial powder (FIG. 23) was obtained from Aldrich Chemical Company, Milwaukee, Wis., and had an average particle size of 0.26 microns.

The absorption spectra of the TiO$_2$ in FIG. 23 is exemplary of bulk TiO$_2$ with a large absorption in the visible and infrared portions of the spectra. In contrast, the absorption spectra of the powders in FIGS. 19–22 have very reduced absorption in the visible and infrared portions of the spectra and enhanced absorption in the ultraviolet. This shift and narrowing of the absorption spectra is due to the reduced size of the particles. The spectra of the laser pyrolysis materials in FIGS. 19–21 have an even more reduced visible absorption and a narrower and enhanced ultraviolet absorption relative to the powders yielding the spectrum in FIG. 22.

Example 3

Surface Treatment of Titanium Oxide Particles

Surface treatment of the three types of TiO$_2$ particles was performed with aminopropyl triethoxy silane (APTES) as a silylation reagent. APTES is thought to bond to the particles by the following reaction:

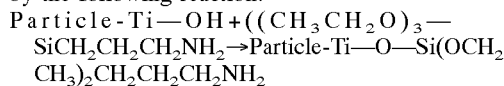
SiCH$_2$CH$_2$CH$_2$NH$_2$→Particle-Ti—O—Si(OCH$_2$CH$_3$)$_2$CH$_2$CH$_2$CH$_2$NH$_2$ Further successive hydrolysis of the ethoxy groups can form additional Si bonds to the particle through ether-type linkages. Some self-polymerization of the silylation reagent can take place also, especially if excess silylation reagent and water are present.

Based on the measured BET surface areas of the particles, the quantity of APTES ½, 1 and 2 of the particle surface relative to a monolayer of the linker was calculated. Excess silylation reagent can be added because not all of the silylation reagent binds and some self-polymerization of the silylation reagent can take place. To calculate the coverage, the APTES was assumed to bond to the particle normal to the surface. Then, an estimate was made on the size of the molecule. This calculation only provides a rough estimate of the coverage. As described below, it was found experimentally that higher coverage could be placed over the surface of the particles than estimated from these calculations.

An experiment was performed to examine the coating of the particles. As described in the following examples, these silylated particles were subsequently used to form polymer composites. In forming these composites, a polymer was reacted with the coated particles without removing them from solution. Ethanol was used as the solvent since one polymer of interest, polyacrylic acid, is more soluble in ethanol than cyclohexanone. In addition, ethanol absorbs moisture better, and moisture was needed to assist with hydrolysis of the ethoxy groups.

To prepare the silylated particles, APTES solutions were prepared in fresh ethanol having traces of water with quantities suitable for 50% coverage, 100% coverage and 200% coverage. Additional reagent was used based on the assumption that some reagent will be left in solution and that the calculated coverage values are only rough estimates. Vials with 100 mg of TiO$_2$-3 and 4 g of solution were prepared outside the dry box to allow moisture uptake. However, extended exposure to water was avoided, and the vials were sealed after solvent addition. The sealed vials were sonicated and then left for about 72 hours.

The powders settled on the bottom of the vials. The supernatant clear solution, i.e., the solution above the settled particles, was removed with a pipette, and fresh ethanol was added. Then, the powders suspended well. The supernatant was found to contain unreacted silylation agent. In the samples prepared with estimated amounts of APTES sufficient for 50% coverage, 100% coverage and 200% coverage, the percent of original APTES that was removed with the supernatant solutions were 44.7%, 28.76 and 32.4%, respectively. Thus, the calculated estimates appear to be low in terms of the coverage of APTES on the particles since more than 100% coverage was obtained when the initial solution had the estimated amount for 200% coverage and less than 50% was recovered.

The interaction with the suspended silylated particles with polyacrylic acid is described in the following Example.

Example 4

Formation of Poly(Acrylic Acid)/Titanium Oxide Particle Composites

The formation of composites with poly(acrylic acid) and TiO$_2$-3 powders with silane based linkers is described in this example. The well suspended APTES coated TiO$_2$-3 particles described in Example 3 were used in these studies.

The polyacrylic acid is thought to react with by way of the carboxylic acid group with the primary amine of the silylation agent to form an amide bond. The first interaction of the polymer with the surface treated particles involves the salt formation of the carboxylic acid with the primary amine. Then, at temperatures of 1400–1600 the salt units condense to form amide bonds. This reaction is depicted schematically as follows:

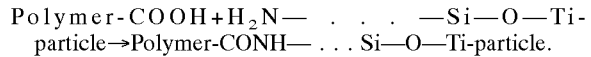

Figure 24:
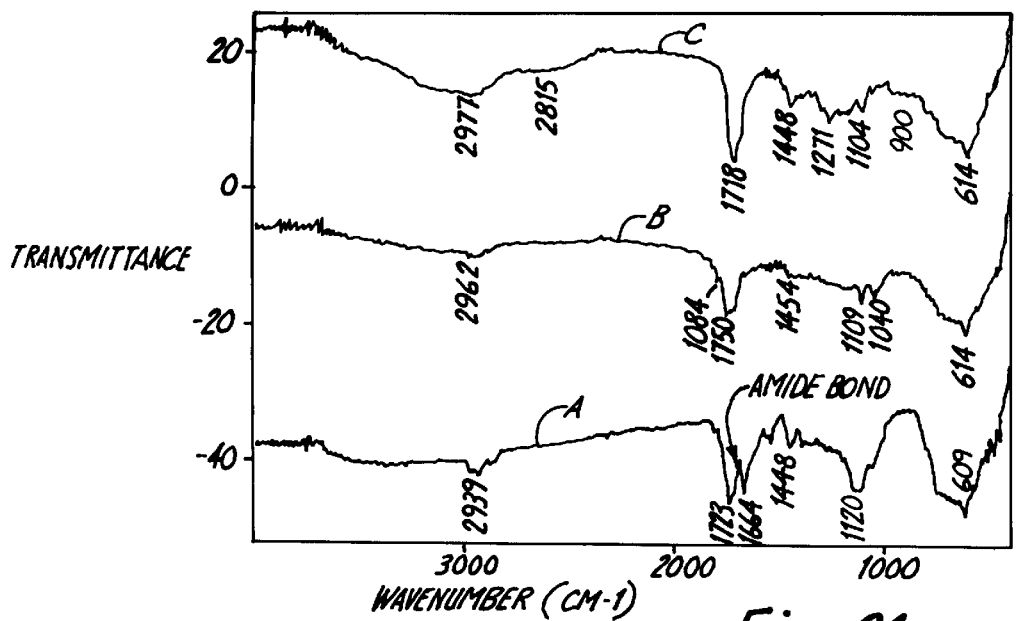
FIG. 24 is a plot of Fourier Transform-Infrared Absorption Spectra for polyacrylic acid alone and two compositions of poly(acrylic acid) titanium oxide composites.

A fourier transform infrared spectrum of the composite had an infrared absorption band at 1664 cm$^{-1}$, which is a frequency characteristic of an amide bond. This infrared absorption spectrum for a composite formed with 2000 MW polymer and twice a monolayer quantity of TiO$_2$-3 particle is shown in FIG. 24 with label A. A corresponding spectrum of a composite formed with unmodified particles is shown in FIG. 24, labeled B. The infrared absorption spectrum for the polymer without any titanium oxide particles is shown in FIG. 24, labeled C. The spectra labeled B and C in FIG. 24 lack the amide absorption band.

Figure 25:
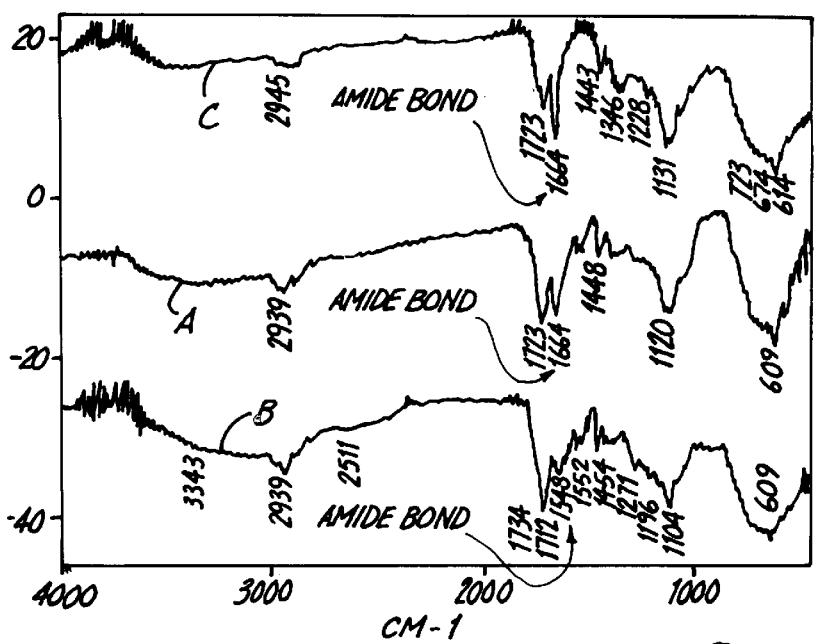
FIG. 25 is a plot of Fourier Transform-Infrared Absorption Spectra for poly(acrylic acid)-titanium oxide composites treated at three different temperatures.
Figure 26:
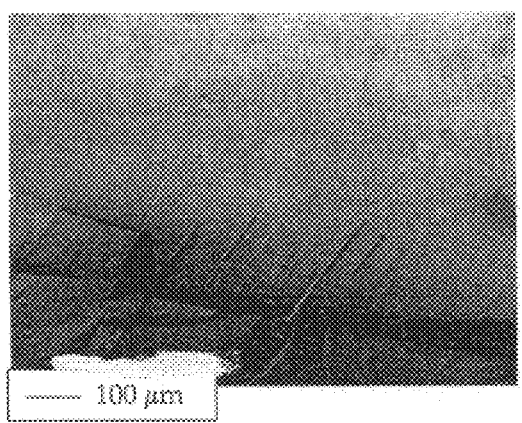
FIG. 26 is a scanning electron micrograph at one magnification of a poly(acrylic acid)-$TiO_2$ composite formed with a 10 weight percent loading of silylated particles.

The spectrum labeled A in FIG. 24 involves a composite treated at 160° C. after combining the constituents. This spectrum is also shown in FIG. 25, labeled A. The spectrum of the composite treated at 120° C., labeled B in FIG. 25, shows less pronounced amide bond formation. The spectrum of a composite treated at 230° C., labeled C in FIG. 25, shows a increase of amide bond structure.

Composites were formed with two different polymer molecular weights and with two different particle loadings. Poly(acrylic acid) (PAA) was also added to a dispersion of particles that was not modified with the silylation agent. The suspended treated particles were separated into equal samples to form the different composites. Higher particle loading samples were produced with 1 equivalent by weight of PAA per titanium oxide particles to produce composites with 50% by weight particles. Lower particle loading samples were produced with 9 equivalents by weight of PAA per titanium oxide particles to produce composites with 10% by weight particles. The low molecular weight polymer had an average molecular weight of 2,000 Daltons, and the high molecular weight polymer had an average molecular weight of 250,000 Daltons. Thus, a total of four types of samples were produced with functionalized $TiO_2$-3 particles, and four control samples were produced with untreated $TiO_2$-3 particles.

Upon applying the composites as a coating, dramatic differences were visible in the microstructure between the samples formed with treated particles and those formed with untreated particles. The coatings were formed by placing drops on a surface. The drops spread on the surface and were allowed to dry. The dried composites were further analyzed. In particular, much smoother materials were formed from the functionalized particles than with the unfunctionalized particles. Similarly, significant differences were observed between samples produced with the high molecular weight polymer and the low molecular weight polymer. The lower molecular weight polymer resulted in smoother materials.

Figure 28:
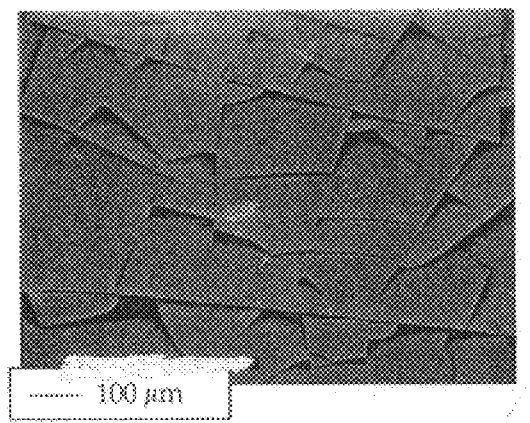
FIG. 28 is a scanning electron micrograph at one magnification of a poly(acrylic acid)-$TiO_2$ composite formed with a 10 weight percent loading of untreated particles.
Figure 27:
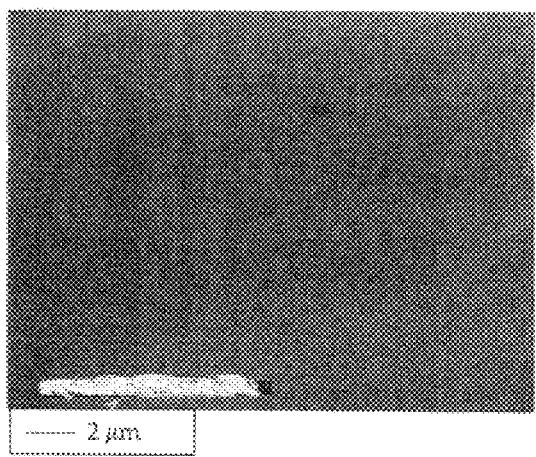
FIG. 27 is a scanning electron micrograph of the composite sample in FIG. 26 at a higher magnification.
Figure 29:
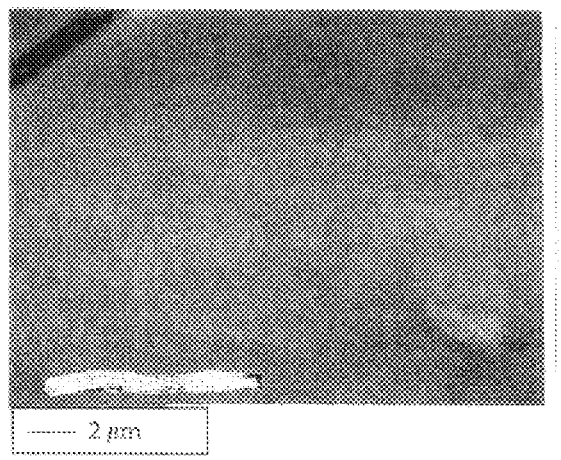
FIG. 29 is a scanning electron micrograph of the composite sample in FIG. 28 at a higher magnification.
Figure 30:
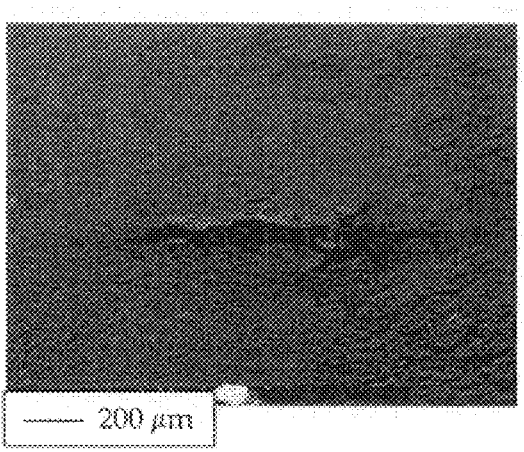
FIG. 30 is a scanning electron micrograph at one magnification of a poly(acrylic acid) (2000 MW)-$TiO_2$ composite formed with a 50 weight percent loading of silylated particles.
Figure 32:
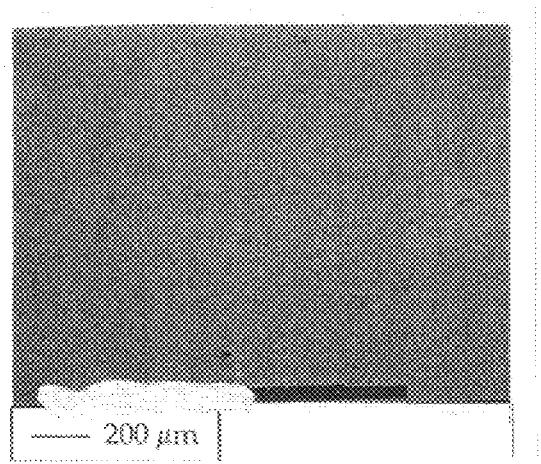
FIG. 32 is a scanning electron micrograph at one magnification of a poly(acrylic acid) (2000 MW)-$TiO_2$ composite formed with a 50 weight percent loading of untreated particles.
Figure 31:
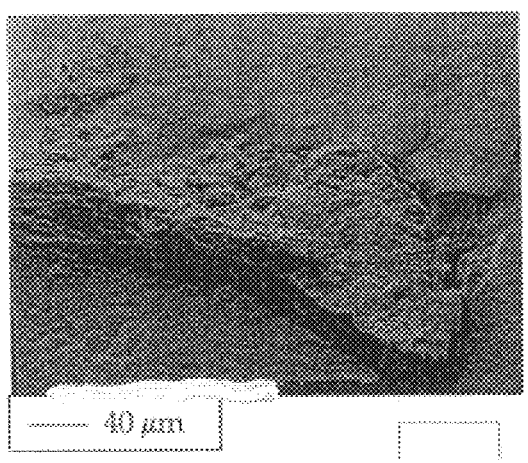
FIG. 31 is a scanning electron micrograph of the composite sample in FIG. 30 at a higher magnification.
Figure 33:
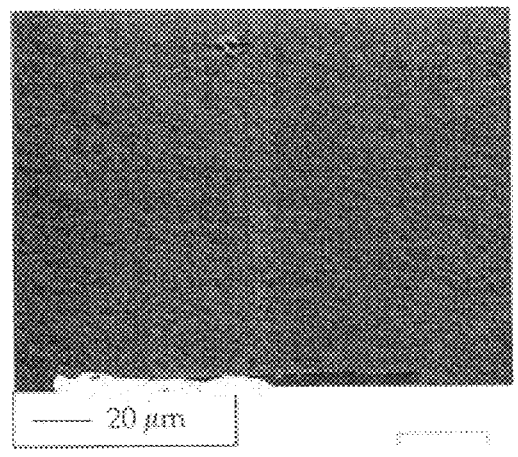
FIG. 33 is a scanning electron micrograph of the composite sample in FIG. 32 at a higher magnification.

Scanning electron micrographs (SEM) were obtained for coatings formed with composites having silylated particles and with untreated particles. SEM photos for silylated, i.e., treated, and, untreated particles with a ten percent particle loading with 2000 MW polymer at two magnifications are shown in FIGS. 26–29. The composites with the treated particles (FIGS. 26 and 27) appear to form a smooth and more homogenous material than the composites formed with the untreated particles (FIGS. 28 and 29). Similarly, SEM photos for composites with treated and untreated particles at a particle loading of 50 weight percent at two magnifications are shown in FIGS. 30–33. Coatings with the treated particles (FIGS. 30 and 31) form a smooth and homogenous coating while the composites with the untreated particles (FIGS. 32 and 33) exhibit agglomeration and a rough surface.

Figure 36:
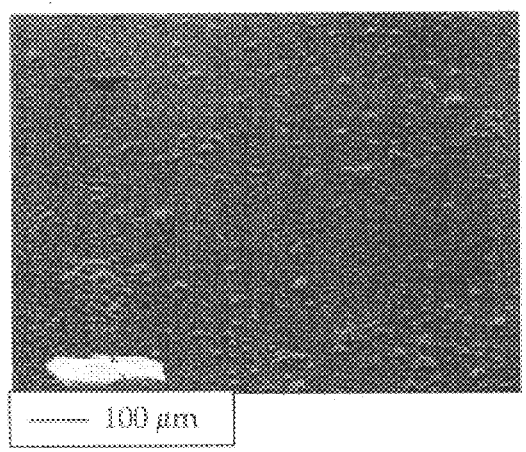
FIG. 36 is a scanning electron micrograph at one magnification of a poly(acrylic acid) (250,000 MW)-$TiO_2$ composite formed with a 10 weight percent loading of untreated particles.
Figure 34:
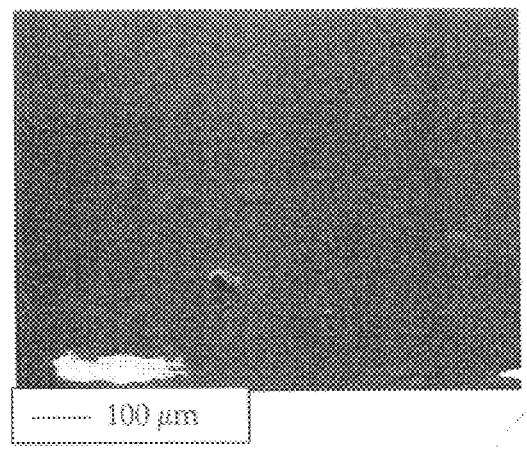
FIG. 34 is a scanning electron micrograph at one magnification of a poly(acrylic acid) (250,000 MW)-$TiO_2$ composite formed with a 10 weight percent loading of silylated particles.
Figure 40:
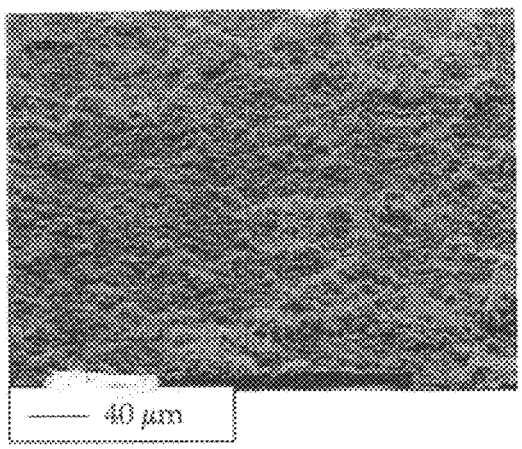
FIG. 40 is a scanning electron micrograph at one magnification of a poly(acrylic acid) (250,000 MW)-$TiO_2$ composite formed with a 50 weight percent loading of untreated particles.
Figure 38:
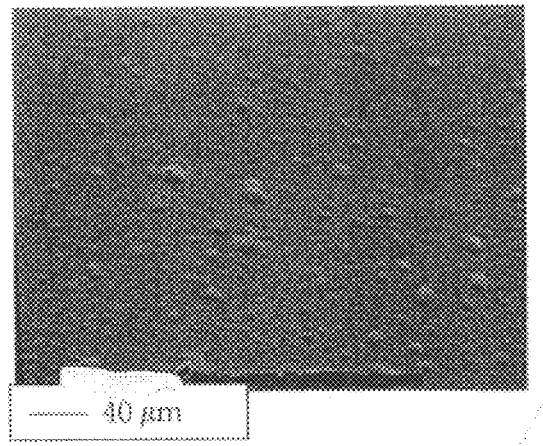
FIG. 38 is a scanning electron micrograph at one magnification of a poly(acrylic acid) (250,000 MW)-$TiO_2$ composite formed with a 50 weight percent loading of silylated particles.
Figure 41:
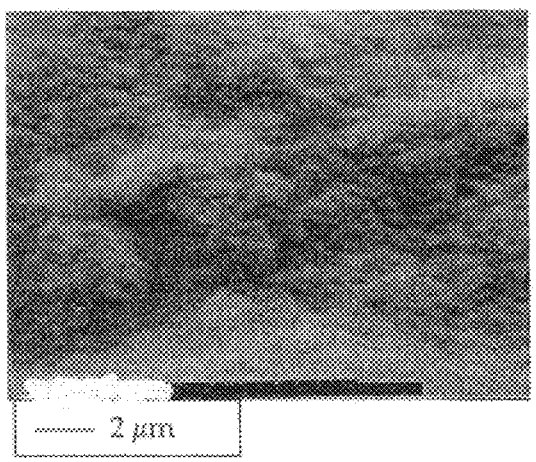
FIG. 41 is a scanning electron micrograph of the composite sample in FIG. 40 at a higher magnification.
Figure 39:
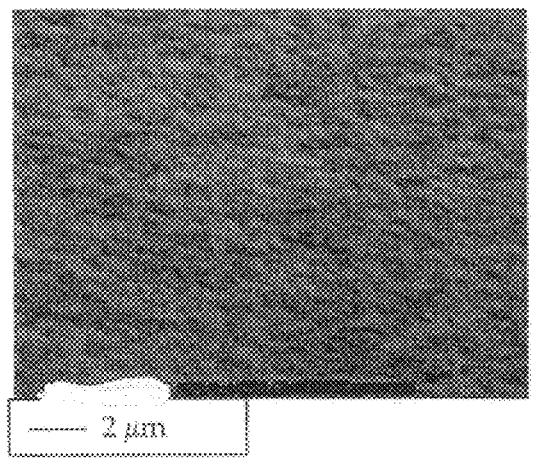
FIG. 39 is a scanning electron micrograph of the composite sample in FIG. 38 at a higher magnification.

Comparable photos were obtained for composites formed with polymer having a molecular weight of 250,000 Daltons. SEM photos for composites with a 10 weight percent loading of particles at two magnifications are shown in FIGS. 34–37. Less agglomeration is observed with the treated particles (FIGS. 34 and 35) than with the composites including the untreated particles (FIGS. 36 and 37). SEM photos for composites with a 50 weight percent loading are shown in FIGS. 38–41. Again, the composites formed with treated particles (FIGS. 38 and 39) form films that are more uniform and less agglomerated than the composites formed with untreated particles (FIGS. 40 and 41).

Figure 42:
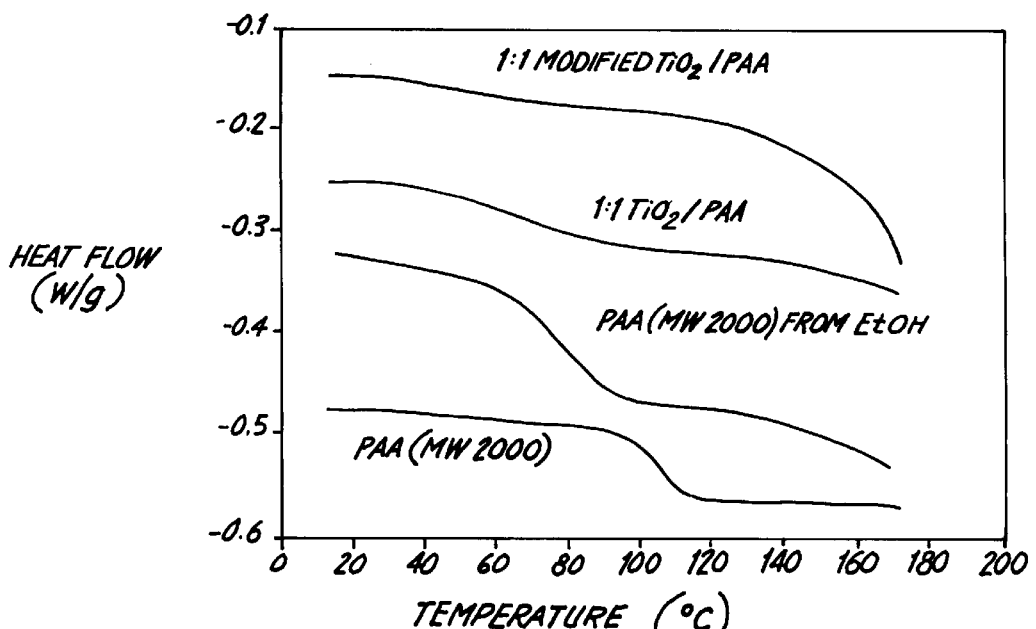
FIG. 42 is a plot of differential scanning calorimetry measurements for two poly(acrylic acid) samples and for two poly(acrylic acid)-$TiO_2$ composites.

Differential scanning calorimetry was used to examine for thermal stability of the composites. The samples were first dried at 60° C. under high vacuum. The results are plotted in FIG. 42 for (1) 50% loading of $TiO_2$ modified with silane linkers and PAA (2000 MW), (2) 50% loading of $TiO_2$ unmodified and PAA (2000 MW), (3) PAA (2000 MW) solidified from ethanol, and (4) PAA (2000 MW) from the manufacturer. The composites formed from the functionalized particles exhibited significantly higher thermal stability.

Example 5

Evidence for Possible Self-Organization With Addition of Polyethylene Glycol

The composite formed with silylation functionalized $TiO_2$ particles and PAA described in Example 4 were further mixed with polyethylene glycol to examine the resulting structure.

The $TiO_2$-PAA composites of Examiner 4 with 50% (1:1) $TiO_2$ loading in PAA (2000 MW) were blended with polyethylene glycol (PEG) in ethanol. The blend included 90 weight percent PEG and 10% weight percent $TiO_2$-PAA composite. The PEG-$TiO_2$-PAA composites were formed into coating by dripping the composite onto to surface and drying the material. Alternatively, the composites were cast into a film. Equivalent results were obtained by the two approaches. For comparison, a polymer blend with no $TiO_2$ particles at all were formed. These polymer blends formed a sticky surface and did not form a smooth surface.

When untreated $TiO_2$ particles were used to form the composite, the resulting mixture after adding the PEG had homogenous dispersed particles within the polymer film. Some random grains were visually observable and slight stripping could be seen. However, when the composite with the silylation functionalized particles were used, there was segregation into domains. Specifically, a pronounced stripe pattern could be seen. The organization into a geometric pattern provides direct evidence of self-organization.

Example 6

Composites with Polyamides

This example involves the formation of titanium oxide/nylon composites. These composites were formed by reacting silylated titanium oxide particles with 6-amino-caproic acid. This example demonstrates the formation of a composite simultaneously with polymerization of the organic species.

Figure 43:
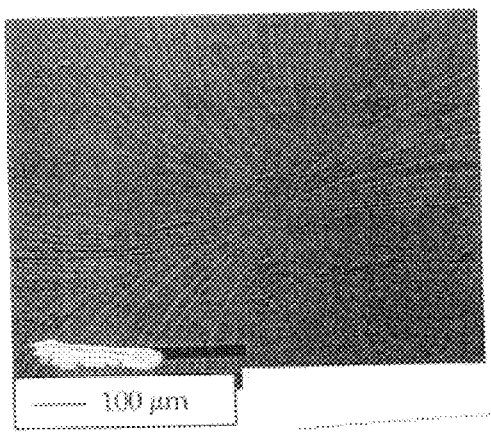
FIG. 43 is a scanning electron micrograph one magnification of a film of polyamide polymer obtained from the polymerization of 6-amino-caproic acid.
Figure 44:
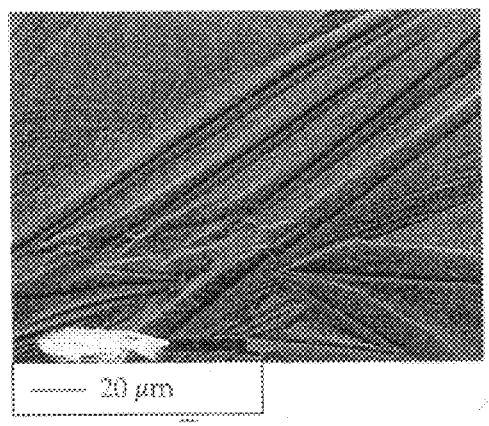
FIG. 44 is a scanning electron micrograph of the film of FIG. 43 at a higher magnification.
Figure 45:
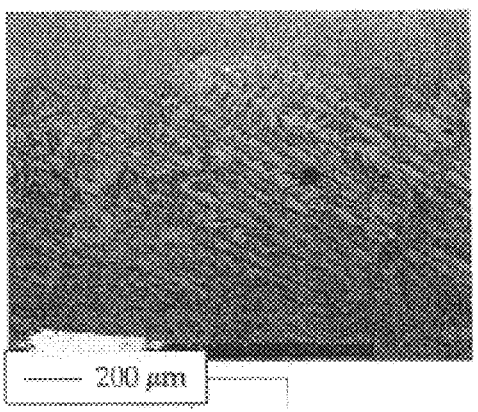
FIG. 45 is a scanning electron micrograph at one magnification of a polyamide-$TiO_2$ composite formed with a 50 weight percent loading of untreated particles.
Figure 46:
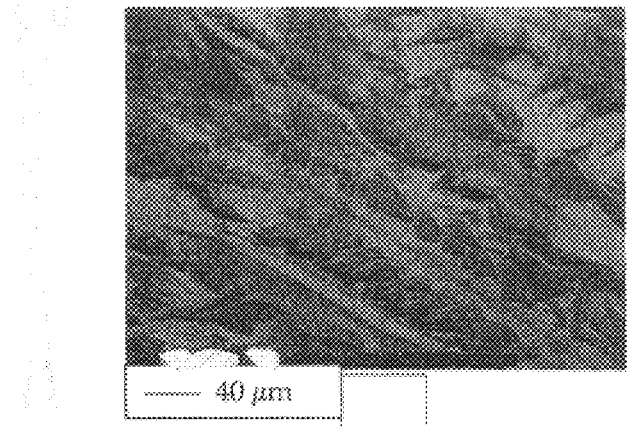
FIG. 46 is a scanning electron micrograph of the composite of FIG. 45 at a higher magnification.
Figure 47:
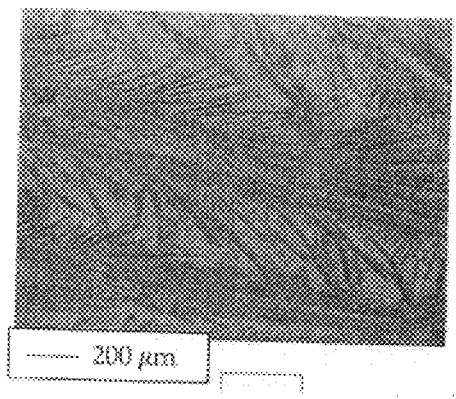
FIG. 47 is a scanning electron micrograph at one magnification of a polyamide-$TiO_2$ composite formed with a 50 weight percent loading of silylated particles.
Figure 48:
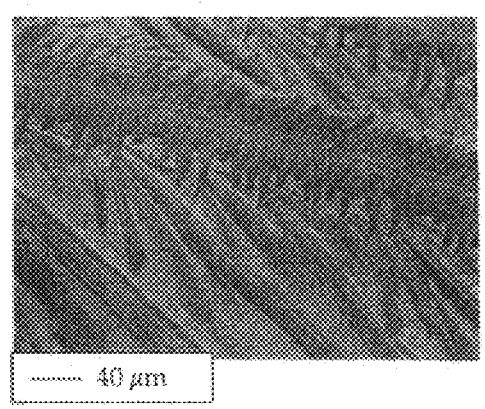
FIG. 48 is a scanning electron micrograph of the composite in FIG. 47 at a higher magnification.

6-amino-caproic acid can self-polymerize to form a polyamide. Following the self-polymerization, a coating of the resulting polyamide forms a small, precise feather-like pattern. The corresponding SEM micrograph for the polymer without any titanium oxide particles is shown in FIGS. 43 and 44 at two magnifications. If untreated particles were used are used to form a composite with the polyamide, the particles segregated within the polymer and did not form a homogenous composite. This is clearly visible in an SEM photographs in FIGS. 45 and 46, at two magnifications. The underlying structure of this material forms a pattern similar to the polyamide polymer alone. However, if the composite was formed with treated, i.e., silylated, $TiO_2$-3 particles, the composite formed a crystallization pattern different from the crystallization pattern formed by the polymer alone. Specifically, the composite formed a pattern with longer range order, multiple branching and ordering on different range scales. For a composite with a 50 weight percent particle loading, SEM photographs are shown in FIGS. 47–48 at two magnifications that demonstrate the incorporation of the particles into a highly ordered structure.

Example 7

Composites with Adipic Acid

This example demonstrates the formation of a composite formed from monomer units. In this case, the monomers are not polymerized themselves. The monomers interact with the functionalized $TiO_2$ particles to form a polymer in which the particles themselves form a star linkages within the overall polymer structure.

Figure 49:
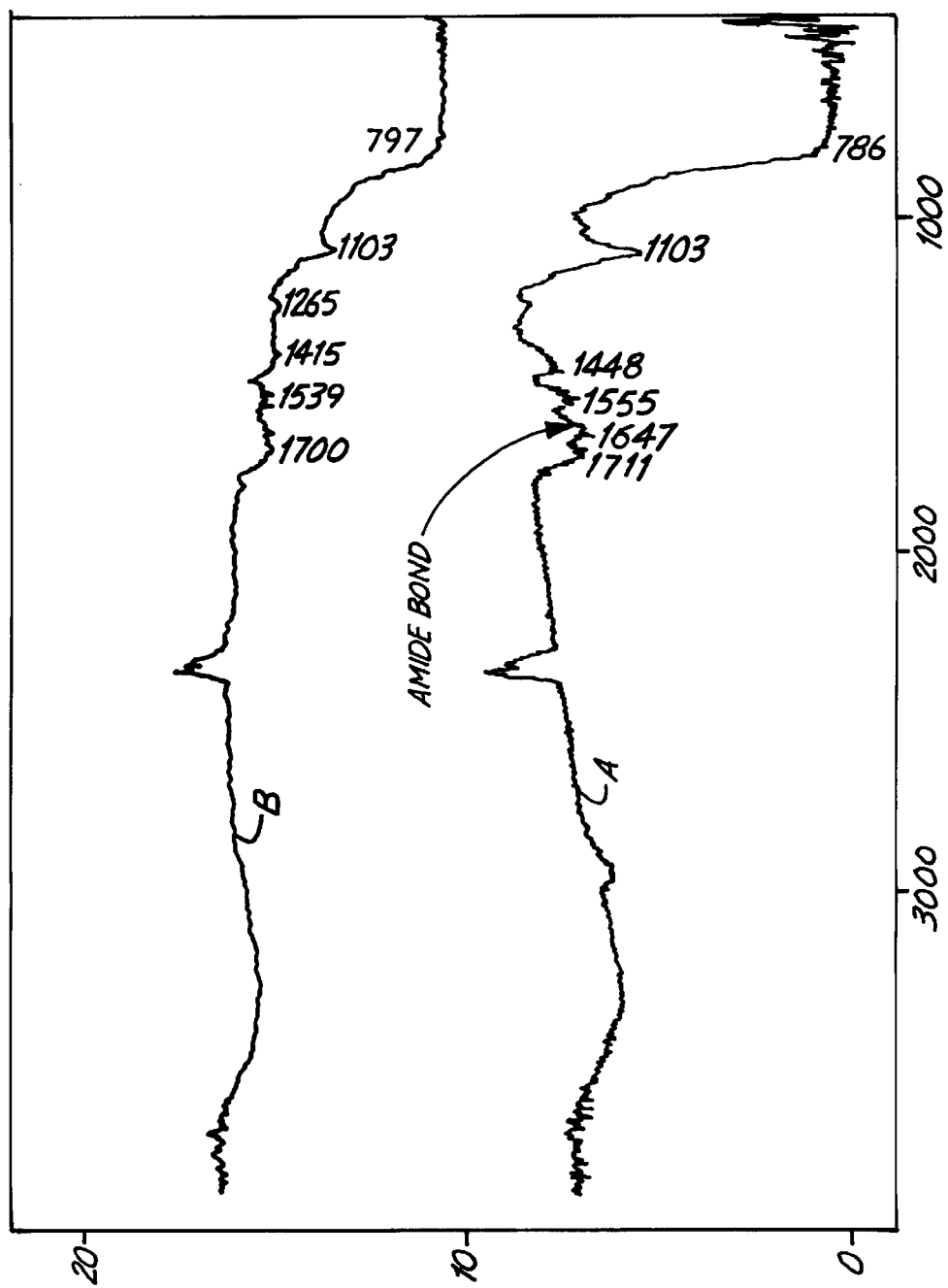
FIG. 49 is a plot of Fourier Transform-infrared spectra for two composites formed from adipic acid and $TiO_2$ polymers.

The monomer unit is adipic acid, $HOOC(CH_2)_6COOH$. The adipic acid can bond to the primary amine of the silylation agent with each carboxylic acid functional group. Thus, a polymer in a network is formed with the adipic acid and the silylated particles functioning as monomer units in the ultimate polymer. Fourier transform infrared measurements provide evidence of amide bond formation when the adipic acid is reacted with the functionalized particles. The infrared spectrum of the composite with silylated particles (A) with an amide bond and untreated particles (B) are shown in FIG. 49.

In the resulting $TiO_2$-polymer composite formed with untreated $TiO_2$ particles forms a homogeneous coating without patterns. In the composite formed with silylated $TiO_2$ particles, there is visible agglomeration of the particles to form a single band that is clearly visible upon inspection.

The embodiments described above are intended to be illustrative and not limiting. Additional embodiments are within the claims. Although the present invention has been described with reference to preferred embodiments, workers skilled in the art will recognize that changes may be made in form and detail without departing from the spirit and scope of the invention.

What is claimed is:

1. A composite composition comprising a polymer having side groups chemically bonded to inorganic particles, wherein the side groups comprise a carbonate group, an imide group, a urethane group, an ureate group, an anhydride group, a sulfide group, a disulfide group, a hydrocarbyl group, an hydridosilane group, an organosilane group, a silazone group, a phosphonate group, or any combination thereof.

2. The composite composition of claim 1 wherein the inorganic particles comprise metal/metalloid particles, metal/metalloid oxides, metal/metalloid nitrides, metal/metalloid carbides, metal/metalloid sulfides, metal/metalloid phosphates, or mixtures thereof.

3. The composite composition of claim 1 wherein the polymer is bonded into the composite through one or more side groups that comprise an organic moiety, a sulfide moiety, a sulphate moiety, a phosphate moiety, a carboxyl moiety, or any combination thereof.

4. The composite composition of claim 1 wherein the chemically bonded side groups comprise a carbonate group, an imide group, a urethane group, an ureate group, an anhydride group, a sulfide group, a disulfide group, a hydrocarbyl group, or any combination thereof.

5. The composite composition of claim 4 wherein the side groups are bonded to the inorganic particle directly at the side group.

6. The composite composition of claim 4 wherein the side groups are bonded also to one or more carbon atoms along a linkage connected to an inorganic particle.

7. The composite composition of claim 1 wherein the side groups are bonded to the inorganic particle at a functional group comprising a phosphonate group, a sulfide group, a sulphonate group or an oxo group.

8. The composite composition of claim 1 wherein the polymer comprises polyamides, polyimides, poly acrylic acid, polyacrylates, polyacrylamides or polysiloxanes.

9. The composite composition of claim 1 having greater than about 6 percent by weight inorganic particles.

10. The composite composition of claim 1 having greater than about 25 percent by weight inorganic particles.

11. The composite composition of claim 1 wherein the inorganic particles have an average particle size less than about 100 nm.

12. The composite composition of claim 1 wherein the inorganic particles have an average particle size less than about 50 nm.

13. The composite composition of claim 1 wherein the chemically bonded side groups comprise an hydridosilane group, an organosilane group, a silane group, a siloxane group, a silazone group, a phosphonate group or any combination thereof.

14. The composite composition of claim 1 wherein the inorganic particles have an average particle size less human about 500 nm.

15. The composite composition of claim 1 wherein effectively no particles have a diameter greater than about 4 times the average diameter.

16. The composite composition of claim 1 wherein at least about 95 percent of the particles have a diameter greater than about 40 percent of the average diameter and less than about 160 percent of the average diameter.

17. A composite composition comprising inorganic particles chemically bonded to a polymer through a linkage comprising a plurality of functional groups, wherein the polymer is selected from the group consisting of polycarbonates, polyimides, polyphosphazenes, heterocyclic polymers, polyacrylonitrile, polyvinyl chloride, conjugated polymers, electrically conducting polymers and mixtures thereof.

18. The composite composition of claim 17 wherein at least one of the functional groups is selected from the group consisting of an ether group, an ester group, an amide group, an imide group, an amine group, an urethane group, all ureate group, a carbonate group, an anhydride group, a sulfide group, a disulfide group, a hydrocarbyl group, an alkoxy group, an hydridosilane group, an organosilane group, a silane group, an siloxane group, a silazone group, a phosphonate group, sulphonate group and combinations thereof.

19. The composite composition of claim 18 wherein at least one of the functional groups is a siloxy group.

20. The composite composition of claim 18 wherein at least one of the functional groups is an ether group, ester group, amide group, or acid anhydride group.

21. The composite composition of claim 17 wherein the particles comprise a metal/metalloid oxide, metal/metalloid carbide, metal/metalloid nitride, metal/metalloid sulfide, metal/metalloid phosphates, or mixtures thereof.

22. The composite composition of claim 17 wherein the polymer is selected from the group consisting of polyamides, polyimides, polyacrylic acid, polyacrylamides, polysiloxanes and mixtures thereof.

23. The composite composition of claim 17 wherein the polymer comprises polymers with conjugated polymer backbones, polymers with aromatic polymer backbones, or mixtures thereof.

24. The composite composition of claim 17 wherein the polymer courses electrically conducting polymers.

25. The composite composition of claim 17 wherein the inorganic particles have an average particle size less than about 500 nm.

26. The composite composition of claim 17 wherein the inorganic particles have an average particle size less than about 100 nm.

27. The composite composition of claim 17 wherein the inorganic particles have an average particle size less than about 50 nm.

28. The composite composition of claim 17 wherein effectively no particles have a diameter greater than about 4 times the average diameter.

29. The composite composition of claim 17 wherein at least about 95 percent of the particles have a diameter greater than about 40 percent of the average diameter and less than about 160 percent of the average diameter.

30. The composite composition of claim 17 having greater than about 6 percent by weight inorganic particles.

31. A composite composition comprising chemically bonded inorganic particles and polymer selected from the group consisting of polyamides, polycarbonates, polyimides, polyphosphazenes, polyurethanes, heterocyclic polymers, polysiloxanes, polyacrylonitrile, polyacrylic acid, polyvinyl alcohol, polyvinyl chloride, conjugated polymers, electrically conducting polymers and mixtures thereof, wherein the polymer is chemically bonded to the inorganic particle through a terminal site of a polymer chain.

32. The composite composition of claim 31 wherein the polymer comprises polyamide, polyimide, polycarbonate, polysiloxane, polyurethanes and mixtures thereof.

33. The composite composition of claim 31 wherein the terminal site comprises a functional group comprising an ether group, an ester group, a carbonate group, an amide group, an imide group, an amine group, a urethane group, an ureate group, an anhydride group, a sulfide group, a disulfide group, a hydrocarbyl group, an alkoxy group, an hydridosilane group, an organosilane group, a silane group, a siloxane group, a silazone group, a phosphonate group or any combination thereof.

34. The composite composition of claim 31 wherein lie polymer is bonded to the inorganic particle directly at the terminal site.

35. The composite composition of claim 31 wherein the polymer is bonded to one or more carbon atoms along a linkage connected to an inorganic particle.

36. The composite composition of claim 31 having greater than about 25 percent by weight inorganic particles.

37. The composite composition of claim 31 wherein the inorganic particles have an average particle size less than about 500 nm.

38. The composite composition of claim 31 wherein the inorganic particles have an average particle size less than about 100 nm.

39. The composite composition of claim 31 wherein the inorganic particles have an average particle size less than about 50 nm.

40. The composite composition of claim 31 wherein effectively no particles have a diameter greater than about 4 times the average diameter.

41. The composite composition of claim 31 wherein at least about 95 percent of the particles have a diameter greater than about 40 percent of the average diameter and less than about 160 percent of the average diameter.

42. The composite composition of claim 31 wherein the particles comprise a metal/metalloid oxide, metal/metalloid carbide, metal/metalloid nitride, metal/metalloid sulfide, metal/metalloid phosphates, or mixtures thereof.

43. A composite composition comprising a polymer chemically bonded to inorganic particles, wherein the inorganic particles comprise a metal.

44. The composite composition of claim 43 wherein the composite has at least about 6 percent by weight inorganic particles.

45. The composite composition of claim 43 wherein the metal comprises gold, silver, copper, platinum or palladium.

46. The composite composition of claim 43 wherein a linkage comprising a plurality of functional groups chemically joins the polymer and the inorganic particle.

47. The composite composition of claim 43 wherein a sulfide group is bonded to the inorganic particle.

48. The composite composition of claim 43 having at least about 25 weight percent inorganic particles.

49. The composite composition of claim 43 wherein the polymer is selected from the group consisting of polyamides, polycarbonates, polyides, polyphosphazenes, polyurethanes, polyacrylates, polyacrylamides, heterocyclic polymers, polysiloxanes, polyacrylonitrile, polyacrylic acid, polyvinyl alcohol, polyvinyl chloride, conjugated polymers, aromatic polymers, electrically conducting polymers and mixtures thereof.

50. The composite composition of claim 43 wherein the inorganic particles have an average particle size less than about 500 nm.

51. The composite composition of claim 43 wherein the inorganic particles have an average particle size less than about 100 nm.

52. The composite composition of claim 43 wherein the inorganic particles have an average particle size less Than about 50 nm.

53. The composite composition of claim 43 wherein effectively no particles have a diameter greater than about 4 times the average diameter.

54. The composite composition of claim 43 wherein at least about 95 percent of the particles have a diameter greater than about 40 percent of the average diameter and less than about 160 percent of the average diameter.

55. A collection of metal/metalloid nitride particles that are chemically bonded with a polymer through a chemical linkage comprising an amide group, a sulfide group, a disulfide group, an alkoxy group, a ester group, or an acid anhydride group.

56. The collection of particles of claim 55 wherein the linkage is bonded to the particle through a siloxane functional group, a phosphonate functional group or an oxo functional group.

57. The composite composition of claim 55 wherein the particles have an average particle size less than about 500 nm.

58. The composite composition of claim 55 wherein the particles have an average particle size less than about 100 nm.

59. The composite composition of claim 55 wherein the particles have an average particle size less than about 50 nm.

60. The composite composition of claim 55 wherein effectively no particles have a diameter greater than about 4 times the average diameter.

61. The composite composition of claim 55 wherein at least about 95 percent of the particles have a diameter greater than about 40 percent of the average diameter and less than about 160 percent of the average diameter.

62. The composite composition of claim 55 having greater than about 6 percent by weight inorganic particles.

63. The collection of particles of claim 55 wherein the particles comprise silicon nitride or silicon oxynitride.

64. The collection of particles of claim 55 wherein the particles comprise a metal nitride.

65. A method for forming chemically bonded polymer inorganic particle composites, the method comprising binding side chain functional groups of polymer units to functional groups of a linker compound bonded to the inorganic particles, wherein the side groups comprise a carbonate group, an amide group, an imide group, an amine group, a urethane group, an ureate group, an anhydride group, a sulfide group, a disulfide group, a hydrocarbyl group, an alkoxy group, an hydridosilane group, an organosilane group, a silane group, a siloxane group, a silazone group, a phosphonate group or any combination thereof.

66. The method of claim 65 wherein the polymer is selected from the group consisting of polyamides, polycarbonates, polyimides, polyphosphazenes, polyurethanes, polyacrylates, polyacrylamides, heterocyclic polymers, polysiloxanes, polyacrylonitrile, polyacrylic acid, polyvinyl alcohol, polyvinyl chloride, conjugated polymers, aromatic polymers, electrically conducting polymers and mixtures thereof.

67. The method of claim 65 wherein the side groups comprise an ether group, an ester group, a carbonate group, an amide group, an imide group, an amine group, a urethane group, an ureate group, an anhydride group, a sulfide group, a disulfide group, a hydrocarbyl group, an alkoxy group, an hydridosilane group, an organosilane group, a silane group, a siloxane group, a silazone group, a phosphonate group or any combination thereof.

68. The method of claim 65 wherein the inorganic particles are bonded to the linker compound prior to introduction of the polymer.

69. The method of claim 65 wherein the inorganic particles, the linker compound and the polymer are combined effectively simultaneously.

70. The method of claim 65 wherein the inorganic particles have an average particle size less than about 500 nm.

71. The method of claim 65 wherein the inorganic particles have an average particle size less than about 100 nm.

72. The method of claim 65 wherein the inorganic particles have an average particle size less than about 50 nm.

73. The method of claim 65 wherein effectively no particles have a diameter greater than about 4 times the average diameter.

74. The method of claim 65 wherein at least about 95 percent of the particles have a diameter greater than about 40 percent of the average diameter and less than about 160 percent of the average diameter.

75. The method of claim 65 wherein the composite comprises greater than about 6 percent by weight inorganic particles.

76. A composite composition comprising a polymer having side groups chemically bonded to inorganic particles having an average particle diameter no more than about 500 nm wherein the inorganic particles comprise a metal or metal compound and wherein effectively no particles have a diameter greater than about 4 times the average diameter.

77. The composite composition of claim 76 wherein the inorganic particles comprise metal particles, metal oxides, metal nitrides, metal carbides, metal sulfides, metal phosphates, or mixtures thereof.

78. The composite composition of claim 76 wherein the polymer is bonded into the composite through one or more side groups that comprise an organic moiety, a siloxy moiety, a sulfide moiety, a sulphate moiety, a phosphate moiety, an amine moiety, a carboxyl moiety, a hydroxyl moiety, or any combination thereof.

79. The composite composition of claim 76 wherein the inorganic particles have an average particle size from about 2 nm to about 100 nm.

80. The composite composition of claim 76 wherein at least about 95 percent of the particles have a diameter greater than about 40 percent of the average diameter and, less than about 160 percent of the average diameter.

81. The composite composition of claim 76 wherein the inorganic particles have an average particle size less than about 50 nm.

82. A composite composition comprising inorganic particles chemically bonded to a polymer through a linkage comprising a plurality of functional groups, wherein the polymer is selected from the group consisting of polyamides, polyimides, polyphosphazenes, polyacrylamides, heterocyclic polymers, polyacrylonitrile, polyacrylic acid, polyvinyl alcohol, polyvinyl, chloride, conjugated polymers, aromatic polymers, electrically conducting polymers and mixtures thereof and wherein the inorganic particles having an average particle diameter no more than about 500 nm wherein the inorganic particles comprise a metal or metal compound.

83. The composite composition of claim 82 wherein the inorganic particles comprise metal particles, metal oxides, metal nitrides, metal carbides, metal sulfides, metal phosphates, or mixtures thereof.

84. The composite composition of claim 82 wherein at least one of the functional groups is selected from the group consisting of an ether group, an ester group, an amide group, an imide group, an amine group, an urethane group, an ureate group, a carbonate group, an anhydride group, a sulfide group, a disulfide group, a hydrocarbyl group, an alkoxy group, an hydridosilane group, an organosilane group, a silane group, a siloxane group, a silazone group, a phosphonate group, a sulphonate group and any mixture thereof.

85. The composite composition of claim 82 wherein the inorganic particles have an average particle size from about 2 nm to about 100 nm.

86. The composite composition of claim 82 wherein effectively no particles have a diameter greater than about 4 times the average diameter.

87. The composite composition of claim 82 wherein at least about 95 percent of the particles have a diameter greater than about 40 percent of the average diameter and less than about 160 percent of the average diameter.

88. The composite composition of claim 82 wherein the inorganic particles have an average particle size less than about 50 nm.

89. The composite composition of claim 82 having greater than about 6 percent by weight inorganic particles.

90. A composite composition comprising chemically bonded inorganic particles and polymer selected from the group consisting of polyamides, polycarbonates, polyimides, polyphosphazenes, polyurethanes, heterocyclic polymers, polysiloxanes, polyacrylonitrile, polyacrylic acid, polyvinyl alcohol, polyvinyl chloride, conjugated polymers, aromatic polymers, electrically conducting polymers and mixtures thereof, wherein the polymer is chemically bonded to the inorganic particle through a terminal site of a polymer chain wherein the inorganic particles have an average diameter less than about 500 nm.

91. The composite composition of claim 90 wherein the inorganic particles have an average particle size less than about 100 nm.

92. The composite composition of claim 90 wherein the inorganic particles have an average particle size less than about 50 nm.

93. The composite composition of claim 90 wherein the inorganic particles comprise metal/metalloid particles, metal/metalloid oxides, metal/metalloid nitrides, metal/metalloid carbides, metal/metalloid sulfides, metal/metalloid phosphates, or mixtures thereof.

94. The composite composition of claim 90 having greater than about 6 percent by weight inorganic particles.

95. The composite composition of claim 90 wherein effectively no particles have a diameter greater than about 4 times the average diameter.

96. The composite composition of claim 90 wherein at least about 95 percent of the particles have a diameter greater than about 40 percent of the average diameter and less than about 160 percent of the average diameter.

97. A composite composition comprising inorganic particles chemically bonded to a polymer through a linkage comprising a plurality of functional groups, wherein the polymer is selected from the group consisting of polyamides, polycarbonates, polyimides, polyphosphazenes, polyurethanes, polyacrylates, polyacrylamides, heterocyclic polymers, polysiloxanes, polyacrylonitrile polyacrylic acid, polyvinyl alcohol, polyvinyl chloride, conjugated polymers, aromatic polymers, electrically conducting polymers and mixtures thereof, wherein the inorganic particles having an average particle diameter no more than about 500 nm, wherein at least about 95 percent of the particles have a diameter greater than about 40 percent of the average diameter and less than about 160 percent of the average diameter and wherein the inorganic particles comprise a metal or metal compound.

98. The composite composition of claim 97 wherein the inorganic particles have an average particle size less than about 100 nm.

99. The composite composition of claim 97 wherein the inorganic particles have an average particle size less than about 50 nm.

100. The composite composition of claim 97 wherein the inorganic particles comprise metals/metalloids, metal/metalloid oxides, metal/metalloid nitrides, metal/metalloid carbides, metal/metalloid sulfides, metal/metalloid phosphates, or mixtures thereof.

101. The composite composition of claim 97 having greater than about 6 percent by weight inorganic particles.

102. The composite composition of claim 97 wherein effectively no particles have a diameter greater than about 4 times the average diameter.

103. A composite composition comprising a polymer having side groups chemically bonded to inorganic particles, wherein the side groups comprise a carbonate group, an imide group, an amine group, a urethane group, an ureate group, an anhydride group, a sulfide group, a disulfide group, a hydrocarbyl group, an alkoxy group, an hydridosilane group, an organosilane group, a silane group, a siloxane group, a silazone group, a phosphonate group, or any combination thereof and wherein the inorganic particles comprise metals/metalloids, metal/metalloid nitrides, metal/metalloid sulfides, metal/metalloid phosphates, or mixtures thereof.

104. The composite composition of claim 103 wherein the polymer is bonded into the composite through one or more side groups that comprise an organic moiety, a siloxy moiety, a sulfide moiety, an amine moiety or combinations thereof.

105. The composite composition of claim 103 wherein the chemically bonded side groups comprise a carbonate group, an imide group, an amine group, a urethane group, an ureate group, an anhydride group, a sulfide group, a disulfide group, a hydrocarbyl group, an alkoxy group or combinations thereof.

106. The composite composition of claim 103 wherein the side groups are bonded to the inorganic particle directly at the side group.

107. The composite composition of claim 103 wherein the side groups are bonded also to one or more carbon atoms along a linkage connected to an inorganic particle.

108. The composite composition of claim 103 wherein the side groups are bonded at a functional group comprising an oxysilane group, a phosphonate group, a sulfide group, or an amine group, to the inorganic particle.

109. The composite composition of claim 103 wherein the polymer comprises polyamides, polyimides, poly acrylic acid, polyacrylates, polyacrylamides or polysiloxanes.

110. The composite composition of claim 103 having greater than about 6 percent by weight inorganic particles.

111. The composite composition of claim 103 having greater than about 25 percent by weight inorganic particles.

112. The composite composition of claim 103 wherein the inorganic particles have an average particle size less than about 500 nm.

113. The composite composition of claim 103 wherein the inorganic particles have an average particle size less than about 100 nm.

114. The composite composition of claim 103 wherein the inorganic particles have an average particle size less than about 50 nm.

115. The composite composition of claim 103 wherein effectively no particles have a diameter greater than about 4 times the average diameter.

116. The composite composition of claim 103 wherein at least about 95 percent of the particles have a diameter greater than about 40 percent of the average diameter and less than about 160 percent of the average diameter.

117. A composite composition comprising a polymer having side groups chemically bonded to inorganic particles having an average particle diameter no more than about 500 nm wherein the inorganic particles comprise a metal or metal compound and wherein at least about 95 percent of the particles have a diameter greater than about 40 percent of the average diameter and less than about 160 percent of the average diameter.

118. The composite composition of claim 117 wherein the inorganic particles have an average particle size less than about 100 nm.

119. The composite composition of claim 117 wherein the inorganic particles have an average particle size less than about 50 nm.

120. The composite composition of claim 117 wherein the inorganic particles comprise metals/metalloids, metal/metalloid oxides, metal/metalloid nitrides, metal/metalloid carbides, metal/metalloid sulfides, metal/metalloid phosphates, or mixtures thereof.

121. The composite composition of claim 117 having greater than about 6 percent by weight inorganic particles.

* * * * *